US012265770B2

(12) United States Patent
Zhang et al.

(10) Patent No.: US 12,265,770 B2
(45) Date of Patent: Apr. 1, 2025

(54) METHOD AND APPARATUS FOR DETERMINING QUANTUM CIRCUIT, AND STORAGE MEDIUM

(71) Applicant: TENCENT TECHNOLOGY (SHENZHEN) COMPANY LIMITED, Shenzhen (CN)

(72) Inventors: Shixin Zhang, Shenzhen (CN); Changyu Hsieh, Shenzhen (CN); Shengyu Zhang, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 704 days.

(21) Appl. No.: 17/524,194

(22) Filed: Nov. 11, 2021

(65) Prior Publication Data

US 2022/0114313 A1    Apr. 14, 2022

Related U.S. Application Data

(63) Continuation of application No. PCT/CN2021/073639, filed on Jan. 25, 2021.

(51) Int. Cl.
*G06F 30/337* (2020.01)
*G06N 10/00* (2022.01)

(52) U.S. Cl.
CPC .......... *G06F 30/337* (2020.01); *G06N 10/00* (2019.01)

(58) Field of Classification Search
CPC .. G06F 16/2455; G06F 16/217; G06F 16/248; G06F 16/9035; G06F 16/906;
(Continued)

(56) References Cited

U.S. PATENT DOCUMENTS 9,881,256 B2 *   1/2018   Hamze ................... G06N 10/00
10,797,869 B1   10/2020   Vakili
(Continued)

FOREIGN PATENT DOCUMENTS

CN    104091214 A    10/2014
CN    108710951 A    10/2018
(Continued)

OTHER PUBLICATIONS

International Search Report of PCT/CN2021/073639 dated Jul. 21, 2021, 9 pages.
(Continued)

*Primary Examiner* — Binh C Tat
(74) *Attorney, Agent, or Firm* — Crowell & Moring LLP

(57) ABSTRACT

This disclosure discloses a method and apparatus for determining a quantum circuit. The method may include sampling an initial circuit unit pool according to an initial sampling manner to obtain initial K groups of circuit units and constructing and generating initial K candidate quantum circuits. The method may further include determining a performance evaluation index corresponding to the initial K candidate quantum circuits and updating the initial sampling manner and a circuit unit in the initial circuit unit pool based on the performance evaluation index, to obtain an updated sampling manner and an updated circuit unit pool. The method may further include sampling the updated circuit unit pool according to the updated sampling manner to obtain updated K groups of circuit units and constructing and generating updated K candidate quantum circuits. The method may further include determining a target quantum circuit from the updated K candidate quantum circuits.

20 Claims, 9 Drawing Sheets

(58) Field of Classification Search

CPC .. G06F 21/44; G06F 21/6245; G06F 2113/10; G06F 30/27; G06F 18/2178; G06F 16/182; G06F 16/24537; G06F 16/24544; G06F 16/24552; G06F 16/2456; G06F 16/2462; G06F 16/2471; G06F 16/27; G06F 16/278; G06F 9/4881; G06F 18/21; G06F 18/25; G06F 9/5044; G06F 9/5055; G06F 21/10; G06F 21/64; G06F 2221/2109; G06F 8/36; G06F 16/137; G06F 18/295; G06F 21/76; G06F 9/5072; G06F 9/5077; G06F 9/522; G06F 9/547; G06F 16/955; G06F 16/9566; G06F 16/9574; G06F 16/958; G06F 18/213; G06F 30/30; G06F 30/337; G06F 9/451; G06F 9/455; G06N 20/00; G06N 3/088; G06N 20/10; G06N 10/00; G06N 10/60; G06N 3/0464; G06N 10/80; G06N 3/086; G06N 3/08; G06N 10/40; G06N 10/70

USPC .................................................. 716/130–136

See application file for complete search history.

(56) References Cited

U.S. PATENT DOCUMENTS

| | | | | |
|---|---|---|---|---|
| 2017/0255872 | A1* | 9/2017 | Hamze | G06F 17/10 |
| 2018/0240032 | A1* | 8/2018 | van Rooyen | G16B 20/20 |
| 2019/0361675 | A1 | 11/2019 | Haener et al. | |
| 2020/0320240 | A1 | 10/2020 | Parrish et al. | |

FOREIGN PATENT DOCUMENTS

| | | |
|---|---|---|
| CN | 109800883 A | 5/2019 |
| CN | 110490327 A | 11/2019 |
| CN | 110674921 A | 1/2020 |
| CN | 111241356 A | 6/2020 |
| CN | 111242306 A | 6/2020 |
| CN | 111461334 A | 7/2020 |
| CN | 111563599 A | 8/2020 |
| CN | 111598247 A | 8/2020 |
| CN | 111598249 A | 8/2020 |
| CN | 111738448 A | 10/2020 |
| CN | 112771552 A | 5/2021 |
| KR | 10-2018-0004226 A | 1/2018 |

OTHER PUBLICATIONS

Office Action issued on Chinese application 202011096965.7 on Dec. 30, 2021, 8 pages.

Allcock, Jonathan et al., "Quantum machine learning", Computer Science, Natl Sci Rev. 2019, vol. 6. No. 1, 3 pages.

Lihua, Wei et al., "Quantum Linear Logic Synthesis Algorithm Based on L-ESOP Reduction", Journal of Computer-Aided Design & Computer Graphics, vol. 30, No. 8, Aug. 2018, 10 pages.

Office Action issued on Japanese application JP 2021-546756 on Feb. 6, 2023, 7 pages.

Grimsley, Harper R. et al., "An adaptive variational algorithm for exact molecular simulations on a quantum computer", Article, *Nature Communications*, Jul. 8, 2019, 9 pages.

Notice of Reasons for Refusal issued Aug. 9, 2023 in corresponding Japanese Patent Application No. 2021-546756 with English translation.

European Communication dated May 20, 2022 issued on application EP21772939.1, 10 pages.

Grimsley, Harper R. et al., "An adaptive variational algorithm for exact molecular simulations on a quantum computer", Nature Communications (2019) 10:3007, 9 pages.

Schuld, Maria et al., "Circuit-centric Quantum Classifiers", Quantum Architectures and Computation Group, Station Q, Microsoft Research, Redmond, WA (Apr. 3, 2018), 17 pages.

Office action issued in Korean application No. 10-2021-7033817, dated Dec. 17, 2024, 22 pages (with English translation).

\* cited by examiner

401

Select $N$ circuit units from a circuit unit pool, the circuit unit pool including a plurality of circuit units, each circuit unit being an equivalent quantum circuit corresponding to a unitary matrix

402

Determine circuit parameters respectively corresponding to the $N$ circuit units, the circuit parameter being for defining an operation performed by the circuit unit, and the circuit parameter being updatable

403

Construct and generate a quantum circuit based on the $N$ circuit units and the circuit parameters respectively corresponding to the $N$ circuit units

Select $N$ circuit units from a circuit unit pool, the circuit unit pool including a plurality of circuit units, each circuit unit being an equivalent quantum circuit corresponding to a unitary matrix

402

Determine circuit parameters respectively corresponding to the $N$ circuit units, the circuit parameter being for defining an operation performed by the circuit unit, and the circuit parameter being updatable

403

Construct and generate a quantum circuit based on the $N$ circuit units and the circuit parameters respectively corresponding to the $N$ circuit units

404

Determine a performance evaluation index corresponding to the quantum circuit

405

Compute target gradient information based on the performance evaluation index, the target gradient information being gradient information of a circuit parameter of the quantum circuit

406

Update the circuit parameter of the quantum circuit based on the target gradient information, to obtain an updated quantum circuit

FIG. 5

METHOD AND APPARATUS FOR DETERMINING QUANTUM CIRCUIT, AND STORAGE MEDIUM

CROSS-REFERENCE TO RELATED APPLICATION

This application is a continuation application of PCT Patent Application No. PCT/CN2021/073639, filed on Jan. 25, 2021, which claims priority to Chinese Patent Application No. 202011096965.7, entitled "QUANTUM CIRCUIT DETERMINING METHOD AND APPARATUS" and filed with the China National Intellectual Property Administration on Oct. 14, 2020, wherein the content of each of the above-referenced applications is incorporated herein by reference in its entirety.

FIELD OF THE TECHNOLOGY

Embodiments of this disclosure relate to the field of quantum technologies, and in particular, to a method and apparatus for determining a quantum circuit, and a storage medium thereof.

BACKGROUND OF THE DISCLOSURE

Quantum circuit is a representation of a quantum general-purpose computer, which represents hardware implementation of a corresponding quantum algorithm/program under a quantum gate model. For different quantum computing tasks, different quantum circuits need to be constructed to complete the corresponding tasks. An existing solution for constructing a quantum circuit has problems of high complexity, low efficiency, and poor versatility.

SUMMARY

Embodiments of this disclosure provide a method and apparatus for determining a quantum circuit, and a storage medium thereof. The technical solutions are as follows:

According to an aspect of the embodiments of this disclosure, a method for determining a quantum circuit is provided. The method may include sampling an initial circuit unit pool according to an initial sampling manner to obtain initial K groups of circuit units and constructing and generating initial K candidate quantum circuits based on the initial K groups of circuit units. Each group of the circuit units may include at least one circuit unit for constructing and generating a candidate quantum circuit, and K is a positive integer. The method may further include determining a performance evaluation index corresponding to the initial K candidate quantum circuits and updating the initial sampling manner and a circuit unit in the initial circuit unit pool based on the performance evaluation index, to obtain an updated sampling manner and an updated circuit unit pool. The method may further include sampling the updated circuit unit pool according to the updated sampling manner to obtain updated K groups of circuit units and constructing and generating updated K candidate quantum circuits based on the updated K groups of circuit units. The method further include, in response to a cycle termination condition being satisfied, determining a target quantum circuit from the updated K candidate quantum circuits According to an aspect of the embodiments of this disclosure, a method for determining a quantum circuit is provided. The method may include selecting N circuit units from a circuit unit pool. The circuit unit pool may include a plurality of circuit units. Each circuit unit is an equivalent quantum circuit corresponding to a unitary matrix, and N is an integer greater than 1. The method may include determining circuit parameters respectively corresponding to the N circuit units. The circuit parameter is for defining an operation performed by the circuit unit, and the circuit parameter is updatable. The method may further include constructing and generating a quantum circuit based on the N circuit units and the circuit parameters respectively corresponding to the N circuit units.

According to an aspect of the embodiments of this disclosure, a method for determining a quantum circuit is provided. The method may include sampling an initial circuit unit pool according to an initial sampling manner to obtain initial K groups of circuit units. The method may further include constructing and generating K candidate quantum circuits. Each of the initial K groups of circuit units may include at least one circuit unit for constructing and generating a candidate quantum circuit, and K is a positive integer. The method may further include determining a performance evaluation index corresponding to the K candidate quantum circuits and updating the initial sampling manner and a circuit unit in the initial circuit unit pool based on the performance evaluation index, to obtain an updated sampling manner and an updated circuit unit pool. The method may further include sampling the updated circuit unit pool according to the updated sampling manner to obtain updated K groups of circuit units and constructing and generating updated K candidate quantum circuits. The method may further include, in response to a cycle termination condition being satisfied, determining a target quantum circuit from the updated K candidate quantum circuits.

According to an aspect of the embodiments of this disclosure, a method for determining a quantum circuit is provided. The method may include selecting N circuit units from a circuit unit pool. The circuit unit pool may include a plurality of circuit units, each circuit unit may be an equivalent quantum circuit corresponding to a unitary matrix, and N is an integer greater than 1. The method may further include determining circuit parameters respectively corresponding to the N circuit units. The circuit parameter is for defining an operation performed by the circuit unit, and the circuit parameter is updatable. The method may further include constructing and generating a quantum circuit based on the N circuit units and the circuit parameters respectively corresponding to the N circuit units.

According to an aspect of the embodiments of this disclosure, an apparatus for determining a quantum circuit is provided. The apparatus may include a memory operable to store computer-readable instructions and a processor circuitry operable to read the computer-readable instructions. The processor circuitry when executing the computer-readable instructions may be configured to sample an initial circuit unit pool according to an initial sampling manner to obtain initial K groups of circuit units, and construct and generate initial K candidate quantum circuits based on the initial K groups of circuit units. Each group of the circuit units may include at least one circuit unit for constructing and generating a candidate quantum circuit, and K is a positive integer. The processor circuitry when executing the computer-readable instructions may be further configured to determine a performance evaluation index corresponding to the initial K candidate quantum circuits and update the initial sampling manner and a circuit unit in the initial circuit unit pool based on the performance evaluation index, to obtain an updated sampling manner and an updated circuit unit pool. The processor circuitry when executing the computer-readable instructions may be further configured to sample the updated circuit unit pool according to the updated sampling manner to obtain updated K groups of circuit units, and construct and generate updated K candidate quantum circuits based on the updated K groups of circuit units. The processor circuitry when executing the computer-readable instructions may be further configured to, in response to a cycle termination condition being satisfied, determine a target quantum circuit from the updated K candidate quantum circuits.

According to an aspect of the embodiments of this disclosure, an apparatus for determining a quantum circuit is provided. The apparatus may include a memory operable to store computer-readable instructions and a processor circuitry operable to read the computer-readable instructions. The processor circuitry when executing the computer-readable instructions may be configured to select N circuit units from a circuit unit pool. The circuit unit pool may include a plurality of circuit units, each circuit unit is an equivalent quantum circuit corresponding to a unitary matrix, and N is an integer greater than 1. The processor circuitry when executing the computer-readable instructions may be further configured to determine circuit parameters respectively corresponding to the N circuit units. The circuit parameter may be for defining an operation performed by the circuit unit, and the circuit parameter is updatable. The processor circuitry when executing the computer-readable instructions may be further configured to construct and generate a quantum circuit based on the N circuit units and the circuit parameters respectively corresponding to the N circuit units.

According to an aspect of the embodiments of this disclosure, a non-transitory computer-readable storage medium is provided. The non-transitory computer-readable storage medium may have processor executable instructions stored thereon for causing a processor circuitry to sample an initial circuit unit pool according to an initial sampling manner to obtain initial K groups of circuit units, and construct and generate initial K candidate quantum circuits based on the initial K groups of circuit units. Each group of the circuit units may include at least one circuit unit for constructing and generating a candidate quantum circuit, and K is a positive integer. The instructions may further cause the processor circuitry to determine a performance evaluation index corresponding to the initial K candidate quantum circuits and update the initial sampling manner and a circuit unit in the initial circuit unit pool based on the performance evaluation index, to obtain an updated sampling manner and an updated circuit unit pool. The instructions may further cause the processor circuitry to sample the updated circuit unit pool according to the updated sampling manner to obtain updated K groups of circuit units and construct and generate updated K candidate quantum circuits based on the updated K groups of circuit units. The instructions may further cause the processor circuitry to, in response to a cycle termination condition being satisfied, determine a target quantum circuit from the updated K candidate quantum circuits.

According to an aspect of the embodiments of this disclosure, a non-transitory computer-readable storage medium is provided. The non-transitory computer-readable storage medium may have processor executable instructions stored thereon for causing a processor circuitry to select N circuit units from a circuit unit pool. The circuit unit pool may include a plurality of circuit units, each circuit unit is an equivalent quantum circuit corresponding to a unitary matrix, and N is an integer greater than 1. The instructions may further cause the processor circuitry to determine circuit parameters respectively corresponding to the N circuit units. The circuit parameter may be for defining an operation performed by the circuit unit, and the circuit parameter is updatable. The instructions may further cause the processor circuitry to construct and generate a quantum circuit based on the N circuit units and the circuit parameters respectively corresponding to the N circuit units.

The technical solutions provided in the embodiments of this disclosure may include the following beneficial effects:

For different types of quantum circuit design problems, the technical solutions of this disclosure can be used to construct a target quantum circuit for resolving a corresponding problem, which highly abstract and unify different types of quantum circuit design problems. The solutions have extremely strong universality and versatility.

In addition, compared with a genetic algorithm having disadvantages of large computational consumption and slow convergence, the technical solutions of this disclosure require only to determine a performance evaluation index corresponding to a candidate quantum circuit obtained by sampling, and update a sampling manner and a circuit unit in a circuit unit pool based on the performance evaluation index, thereby quickly constructing a candidate quantum circuit with better performance, which not only reduces computational workload, but also improves efficiency of determining a final target quantum circuit.

BRIEF DESCRIPTION OF THE DRAWINGS

To describe technical solutions in embodiments of this disclosure more clearly, the following briefly introduces the accompanying drawings required for describing the embodiments. Apparently, the accompanying drawings in the following description show only some embodiments of this disclosure, and a person of ordinary skill in the art may still derive other drawings from these accompanying drawings without creative efforts.

FIG. 4 is a flowchart of a method for determining a quantum circuit according to another embodiment of this disclosure.

FIG. 5 is a flowchart of a method for determining a quantum circuit according to another embodiment of this disclosure.

DESCRIPTION OF EMBODIMENTS

Figure 1:
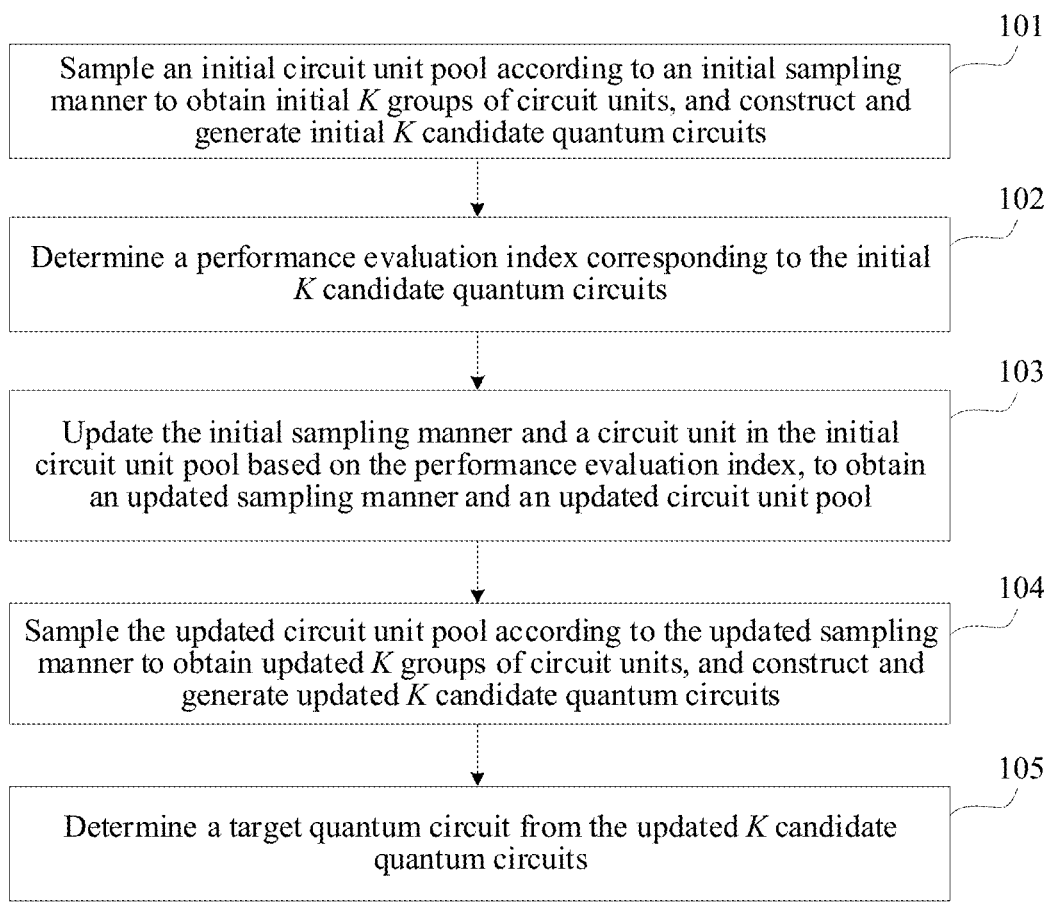
FIG. 1 is a flowchart of a method for determining a quantum circuit according to an embodiment of this disclosure.

To make objectives, technical solutions, and advantages of this disclosure clearer, the following further describes implementations of this disclosure in detail with reference to the accompanying drawings.

Cloud technology is a hosting technology that unifies a series of resources such as hardware, software, and networks in a wide area network or a local area network to implement computing, storage, processing, and sharing of data.

The cloud technology is a generic term for a network technology, an information technology, an integration technology, a management platform technology, an application technology, and the like based on an application of a cloud computing business mode. A resource pool may be formed, and resources are used based on a requirement, which is flexible and convenient. A cloud computing technology becomes an important support. A backend service of a technical network system requires a large amount of computing and storage resources, such as a video website, an image website, and more portal websites. As the Internet industry is highly developed and applied, each article may have its own identifier in the future, which needs to be transmitted to a backend system for logic processing. Data at different levels is separately processed, and data in various industries requires strong system support, which can be implemented through cloud computing.

The cloud technology involves basic technologies such as cloud computing, cloud storage, databases, and big data. Cloud applications provided based on the cloud technology include medical cloud, cloud Internet of things (IoT), cloud security, cloud calling, private cloud, public cloud, hybrid cloud, cloud gaming, cloud education, cloud conference, cloud social, artificial intelligence cloud services, and the like. With the development of cloud technologies and the application of cloud technologies in different fields, an increasing number of cloud applications appear.

Generally, a system based on a cloud technology includes a server and a terminal. The server may be an independent physical server, or may be a server cluster or a distributed system including a plurality of physical servers, or may be a cloud server that provides a basic cloud computing service such as a cloud service, a cloud database, cloud computing, a cloud function, cloud storage, a network service, cloud communication, a middleware service, a domain name service, a security service, a content delivery network (CDN), big data, and an artificial intelligence platform. The terminal may be a smartphone, a tablet computer, a notebook computer, a desktop computer, a smart speaker, a smartwatch, or the like, but is not limited thereto. The terminal and the server may be directly or indirectly connected in a wired or wireless communication manner. This is not limited in this embodiment of this disclosure.

A quantum computer is a machine that uses the principles of quantum mechanics to perform computations. Based on a superposition principle and quantum entanglement of the quantum mechanics, the quantum computer has a strong parallel processing capability and can resolve some problems that are difficult for a classical computer to compute. Because of a zero-resistance characteristic of a superconducting quantum bit (qubit) and a manufacturing process close to that of an integrated circuit, a quantum computing system constructed using the superconducting qubit is one of the most promising systems for implementing practical quantum computing.

A quantum processor refers to a quantum-level computer processor, that is, a processor of a quantum computer. The quantum processor may include one or more quantum chips.

The quantum chip (or a superconducting quantum chip) is a central processing unit of the quantum computer and is a core part of the quantum computer. The quantum chip integrates quantum circuits on a substrate, to carry a function of quantum information processing. Drawing lessons from the development of a conventional computer, after overcoming the bottleneck technology in quantum computer research, it is necessary to move onto integration to achieve commercialization and industrial upgrading. A superconducting system, a semiconductor quantum dot system, a micro-nano photonics system, and even an atomic and ion system are all expected to move onto chips. From the perspective of development, an superconducting quantum chip system is technically ahead of other physical systems, and the conventional semiconductor quantum dot system is also an objective that people try to explore, because the development of the conventional semiconductor industry is already mature, for example, once a semiconductor quantum chip breaks a threshold of fault-tolerance quantum computing (FTQC) in terms of decoherence time and manipulation accuracy, it is expected to integrate existing achievements of the conventional semiconductor industry to reduce development costs.

In view of advantages of the quantum computer, a system constructed based on a cloud technology in the future can use the quantum computer to perform some processing and computations to provide better services.

Before the technical solutions of this disclosure are described, some key terms involved in this disclosure are explained first.

1. Quantum computing is a computing manner based on quantum logic, and a basic unit for storing data is a qubit.

2. Qubit is a basic unit of quantum computing. A conventional computer uses 0 and 1 as a basic unit of binary. The difference is that quantum computing can simultaneously process 0 and 1, and a system can be in a linear superposition state of 0 and 1: $|\psi\rangle = \alpha|0\rangle + \beta|1\rangle$, $\alpha$, $\beta$ representing complex probability amplitudes of the system on 0 and 1, whose modulus squares $|\alpha|^2$, $|\beta|^2$ respectively represent probabilities of being at 0 and 1.

3. Quantum circuit is a representation of a quantum general-purpose computer, which represents hardware implementation of a corresponding quantum algorithm/program under a quantum gate model.

4. Hamiltonian is a Hermitian conjugate matrix describing total energy of a quantum system. Hamiltonian is a physical term and is an operator that describes total energy of a system, usually represented by H.

5. Eigenstate: For a Hamiltonian matrix H, a solution that satisfies an equation $H|\psi\rangle = E|\psi\rangle$ is referred to as an eigenstate $|\psi\rangle$ of H, which has an eigen-energy E. A ground state corresponds to the eigenstate with the lowest energy of the quantum system.

6. Neural architecture search (NAS) is a key field of automated machine learning (AutoML), which uses a plurality of different underlying technical solutions such as reinforcement learning, genetic algorithms, and DQAS to enable a computer to automatically search and construct a neural network topology and a structure with excellent performance.

7. Quantum architecture search (QAS) is a generic term for a series of tasks and solutions that attempt to automatically and programmatically search for a structure, a pattern, and an arrangement of a quantum circuit. In conventional work of searching for a quantum structure, a greedy algorithm, reinforcement learning, or a genetic algorithm is usually used as a core technology.

8. Quantum classical hybrid computing is a computing paradigm in which an inner layer uses quantum circuits for computations, and an outer layer uses a conventional classical optimizer to adjust a variational quantum circuit parameter. This can maximize advantages of quantum computing and is believed to be one of the important directions that has potential to prove quantum advantages.

9. Quantum approximate optimization algorithm (QAOA) is a specific quantum circuit structure hypothesis. A quantum state generated by such a quantum circuit can be used to approximate a result of a non-deterministic polynomial (NP)-complete combinatorial mathematical optimization problem. The QAOA is a typical quantum classical hybrid computing paradigm. A definition of this specific quantum circuit is as follows:

$$|\psi\rangle = \prod_{j=0}^{P} (e^{iH_c \gamma_j} e^{iH_b \beta_j})|\psi_0\rangle$$

where $H_c$, $H_b$ are respectively a mixer Hamiltonian and a phase Hamiltonian, and $\gamma$, $\beta$ are variational parameters. Generally, $H_c$ is the same as an objective function to be optimized. $|\psi_0\rangle$ is an initial wave function that is easy to prepare, which is usually a direct product state $\otimes|+\rangle$, and $|\psi\rangle$ is a target state wave function. P represents the number of layers arranged in the QAOA hypothesis. P with a larger value indicates being closer to adiabatic approximation, the target state wave function being closer to a theoretical result, and an approximation effect being better.

10. Max-Cut problem is a typical NP-complete graph theory combinatorial optimization problem, which is also the earliest problem resolved by the QAOA. Max-Cut refers to finding a dichotomy solution of nodes for a graph with given nodes and edge connections, to maximize the number of edges (or a sum of weights of edges) across two types of nodes.

11. Noisy intermediate-scale quantum (NISQ) is a current stage of the development of quantum computing and an important research direction. At this stage, the quantum computing cannot be used as an engine for general-purpose computing temporarily because of limitations of scale and noise, but on some problems, results of the strongest classical computer are surpassed. This is usually referred to as quantum hegemony or quantum superiority.

12. Quantum error mitigation corresponds to quantum error correction and is a series of quantum error mitigation and noise suppression solutions with lower resource costs under hardware in an NISQ era. Compared with complete quantum error correction, resources required by the quantum error mitigation are significantly reduced. The quantum error mitigation is merely applicable to a specific task, which is not a general solution.

13. Variational-quantum-eigensolver (VQE) implements estimation of ground state energy of a specific quantum system through variational circuits and is also a typical quantum classical hybrid computing paradigm, which is widely used in the field of quantum chemistry.

At present, a relatively conventional solution for constructing a quantum circuit is to use a genetic algorithm. A basic method is to fix a part of a circuit structure of the quantum circuit and then use the genetic algorithm to find an optimal circuit structure for a next part, and repeat the process a plurality of times to construct a complete quantum circuit finally. However, because of large computational workload and low efficiency of the genetic algorithm, construction of the quantum circuit is extremely complex and inefficient. In addition, the solution is poor in versatility. For example, different types of genetic algorithms need to be selected for different quantum computing tasks.

This disclosure provides a technical solution for constructing a quantum circuit. The technical solution may be referred to as a DQAS solution (or a DQAS framework). Under the DQAS framework provided in this disclosure, different types of quantum circuit design problems can be highly abstracted and unified, making the framework universal, which can resolve important problems in a plurality of sub-fields without modification. For example, a quantum circuit constructed using this framework may be used in a plurality of sub-fields of quantum computing and quantum information processing, including but not limited to quantum state preparation, quantum circuit design, quantum compilation, optimal variational structure search, and quantum error suppression. By using this framework, an optimal quantum circuit structure and a circuit parameter can be automatically designed and discovered, thereby achieving fully automatic multi-target and end-to-end quantum circuit design.

The following first provides a general description for the technical solution of this disclosure.

Any quantum circuit can be regarded as being formed by stacking a series of unitary matrices, that is:

$$U = \prod_{i=0}^{P} U_i(\theta_i)$$

where U represents a quantum circuit, $U_i$ represents an equivalent quantum circuit corresponding to an $i^{th}$ unitary matrix forming the quantum circuit U, $\theta_i$ represents a circuit parameter of the equivalent quantum circuit corresponding to the $i^{th}$ unitary matrix, for example, $\theta_i$ may include zero to a plurality of circuit parameters, i∈[0, p], and i is an integer. The circuit parameter of the quantum circuit is a variational parameter. The variational parameter means that the circuit parameter of the quantum circuit is updatable (that is, adjustable and modifiable), so that the circuit parameter of the quantum circuit may be updated by using an optimizer to optimize an objective function. Any quantum circuit is regarded as being formed by stacking a series of unitary matrices, so that a search solution is not limited to hypothetical circuit search of a quantum classical hybrid computing paradigm, but is applicable to a wider range of problems with or without circuit parameters. That is, this solution may also be used for finding optimal quantum circuit design of a completely discrete quantum gate arrangement. This solution is compatible regardless of a variational parameter of a circuit.

To prepare the quantum circuit U described in the foregoing formula, it is necessary to set a coding solution for a specific problem, that is, what does each placeholder $U_i$ represent, which may be a single-bit gate, or a one-layer quantum gate, or a time-dependent evolution $e^{iH\theta}$ of a Hamiltonian. In the embodiments of this disclosure, a circuit unit pool is constructed. The circuit unit pool includes a plurality of selectable circuit units. Each circuit unit may be regarded as a unitary matrix circuit, that is, an equivalent quantum circuit of a unitary matrix. For some basic operations that may be involved in a quantum computing task, a corresponding circuit unit is designed for each basic operation. For example, a circuit unit may be a single-bit quantum gate, a one-layer quantum gate, or a time-dependent evolution of a Hamiltonian, which is not limited in the embodiments of this disclosure. Each placeholder $U_i$ is filled by selecting a circuit unit from the circuit unit pool. The selection is performed in a replacement manner to ensure that each circuit unit may be reused in a final constructed quantum circuit.

For each specific quantum circuit design task, a suitable objective function needs to be specified. For the most common quantum classical hybrid computing, a paradigm of this type of optimization problem is to use an expected sum of a series of observations H as an optimized objective function. The observations (also referred to as observed quantities) refer to some Hermitian matrix operators that can measure classical output. That is, an objective function L is:

$$L = \langle 0|U^\dagger H U|0\rangle$$

where U is a quantum circuit to be searched and constructed, and $U^\dagger$ is a transposed conjugate of a corresponding circuit matrix. For more complex requirements, an optimized objective function may be some function expected by an observation $H_i$, so that expectation and specific distribution of an output quantum state may be considered in the optimized objective function. In this case, a more general objective function L can be expressed as:

$$L = \sum_i g_i(\langle 0|U^\dagger f_i(H_i)U|0\rangle)$$

where $f_i$, $g_i$ are arbitrary differentiable functions suitable for a specific task, which means that the final objective function L is a specific transformation of an observation result.

More generally, for other tasks such as quantum machine learning, the objective function L may be defined as the following form similar to conventional supervised learning:

$$L = \sum_j \left(\sum_i g_i(\langle \psi_j|U^\dagger f_i(H_i)U|\psi_j\rangle) - y_j\right)^2$$

where $f_i$, $g_i$ are arbitrary differentiable functions suitable for a specific task, $|\psi j\rangle$ is a data set inputted by a corresponding quantum wave function, and $y_j$ is a classical label corresponding to a corresponding quantum state of the data set and is usually 0 or 1.

For a general unitary matrix learning task, a corresponding objective function L is:

$$L = \sum_i \langle \phi_i|U|\psi_i\rangle$$

where $\phi_i$, $\psi_i$ respectively an input state and an output state of a circuit. If i has only one value and specially, $|\psi i\rangle = |0\rangle$, it corresponds to a quantum state preparation task. The objective function in this case represents fidelity of an output quantum state obtained after an action of a circuit U is performed on an input simple direct product state $|0\rangle$, and fidelity of a prepared target state $|\phi\rangle$. A circuit to prepare a corresponding quantum state may be found by optimizing the objective function.

In a word, because an entire computing process supports automatic differentiation, a feature of such automatic differentiation enables the DQAS framework to support an end-to-end optimized objective function in any form well. A gradient required for entire circuit parameter adjustment and optimization may be propagated back from change of a final objective function. This process only requires that a component defined by the objective function supports automatic differentiation, and almost all functions with good properties meet this requirement.

To embed parameters that control a quantum circuit structure into a continuous domain, in this disclosure, a process of selecting circuit units to form a quantum circuit is considered as being controlled by a probability model. The probability model P may be a sufficiently universal energy model or an autoregressive network. In an embodiment, simplest layer-by-layer discrete distribution may be selected to perform a process of selecting circuit units from the circuit unit pool to construct a quantum circuit. The probability model has a continuous parameter $\alpha$, so that a structural parameter k of discrete integers is sampled from a probability model $P(k, \alpha)$, which determines a structure of a corresponding quantum circuit.

Finally, an end-to-end optimized objective function $\mathcal{L}$ is shown as follows:

$$\mathcal{L} = \sum_{k \sim P(k,\alpha)} L(U(k, \theta))$$

where $P(k, \alpha)$ represents the probability model, $U(k, \theta)$ represents a candidate quantum circuit constructed and generated based on the structural parameter k, the structural parameter k may include a plurality of discrete values used to represent circuit units obtained by sampling this time, and $L(U(k, \theta))$ represents an objective function corresponding to the candidate quantum circuit $U(k, \theta)$.

Before a method embodiment of this disclosure is described, a running environment of the method is described first. The quantum circuit determining method provided in the embodiments of this disclosure may be implemented by a classical computer (for example, a personal computer (PC)). For example, the classical computer is used to execute a corresponding computer program to implement the method. The method may be alternatively performed in a hybrid device environment of a classical computer and a quantum computer. For example, the classical computer performs steps such as circuit sampling, parameter updating, and circuit selection, and the quantum computer performs steps such as determining a performance evaluation index (for example, an objective function) corresponding to a candidate quantum circuit. This is because a corresponding performance evaluation result of directly deploying a quantum circuit on the quantum computer for execution is theoretically supposed to be better than simulating the quantum circuit on the classical computer.

In the following method embodiment, for ease of description, the description is provided by merely using a computer device as an execution entity of steps. It is to be understood that the computer device may be a classical computer or may be a hybrid execution environment including a classical computer and a quantum computer. This is not limited in the embodiments of this disclosure.

FIG. 1 is a flowchart of a quantum circuit determining method according to an embodiment of this disclosure. An execution entity of steps of this method may be a computer device. The method may include the following steps (101 to 105):

Step 101. Sample an initial circuit unit pool according to an initial sampling manner to obtain K groups of circuit units, and construct and generate K candidate quantum circuits, K being a positive integer.

The circuit unit pool includes a plurality of selectable circuit units. In this embodiment of this disclosure, the circuit unit is a basic unit that forms a quantum circuit, and one quantum circuit may include one or more circuit units. When the quantum circuit includes a plurality of circuit units, a connection relationship between the circuit units may be pre-defined or designed. In an example, a quantum circuit has a multi-layer structure, each layer includes a circuit unit, and layers are connected in sequence. For example, an output result of a circuit unit of a layer may be used as input data of a circuit unit of a next layer, and the data is further computed or processed through the circuit unit of the next layer. In another example, a quantum circuit has a multi-layer structure, and each layer includes one or more filling positions for filling a circuit unit. When there are a plurality of filling positions in the same layer, the filling positions may be connected in advance in a preset manner.

For some basic operations that may be involved in a quantum computing task, a corresponding circuit unit is designed for each basic operation. For example, a circuit unit may be a single-bit quantum gate, a one-layer quantum gate, or a time-dependent evolution of a Hamiltonian, which is not limited in this embodiment of this disclosure.

The sampling manner refers to a manner of selecting a circuit unit from the circuit unit pool. One or more circuit units are selected from the circuit unit pool during each time of sampling, and the one or more circuit units selected in one time of sampling form one group of circuit units, that is, each group of circuit units includes at least one circuit unit. In this embodiment of this disclosure, each group of circuit units is used for constructing and generating a candidate quantum circuit. In addition, a circuit unit included in the each group of circuit units is repeatable. That is, the foregoing sampling process is performed in a replacement manner to ensure that each circuit unit may be reused in a final constructed quantum circuit.

For example, the initial circuit unit pool includes five circuit units respectively numbered 0, 1, 2, 3, and 4. It is assumed that three-time sampling is performed from the initial circuit unit pool according to the initial sampling manner, to obtain three groups of circuit units. It is assumed that a group of circuit units obtained in first-time sampling includes three circuit units numbered 2, 1, 3 respectively, a group of circuit units obtained in second-time sampling includes three circuit units numbered 2, 1, 1 respectively, and a group of circuit units obtained in third-time sampling includes three circuit units numbered 2, 1, 4 respectively. Subsequently, according to the sampling results, three candidate quantum circuits are constructed and generated.

Step 102. Determine a performance evaluation index corresponding to the K candidate quantum circuits.

The performance evaluation index is a parameter for quantizing and evaluating performance of a candidate quantum circuit. In this embodiment of this disclosure, the performance evaluation index corresponding to the K candidate quantum circuits is a parameter for evaluating comprehensive performance or average performance of the K candidate quantum circuits, reflecting an overall situation or average situation of respective performance of the K candidate quantum circuits.

In an exemplary embodiment, the performance evaluation index is represented by using an objective function. The objective function is a mathematical function for computing whether a quantum circuit constructed and generated reaches a task optimization objective. For example, as described above, for different quantum circuit design tasks, different objective functions may be set correspondingly.

Step 103. Update the sampling manner and a circuit unit in the circuit unit pool based on the performance evaluation index, to obtain an updated sampling manner and an updated circuit unit pool.

The performance evaluation index is used for guiding adjustment of the sampling manner and a circuit parameter of a circuit unit, to obtain a candidate quantum circuit with better performance by sampling. On the one hand, the sampling manner is updated based on the performance evaluation index to optimize the sampling manner and select better circuit units from the circuit unit pool for combination; on the other hand, a circuit unit in the circuit unit pool is updated based on the performance evaluation index, for example, a circuit parameter of the circuit unit is updated, to optimize performance of a single circuit unit, to help improve overall performance of a constructed quantum circuit.

Step 104. Sample the updated circuit unit pool according to the updated sampling manner to obtain K groups of circuit units, and construct and generate K candidate quantum circuits.

A sampling process in step 104 is the same as or similar to the sampling process described in step 101. A difference is that the sampling manner and the circuit parameter of the circuit unit in the circuit unit pool are updated. In step 104, the updated circuit unit pool is sampled according to the updated sampling manner to obtain K groups of circuit units.

The number of sampling times in step 104 may be the same as or different from the number of sampling times in step 101. For example, when the number of sampling times in step 104 is the same as the number of sampling times in step 101, for example, if K in step 101 is equal to 10, K in step 104 is also equal to 10. In another example, when the number of sampling times in step 104 is different from the number of sampling times in step 101, for example, if K in step 101 is equal to 10, K in step 104 is equal to 8. Because a probability model corresponding to the sampling manner tends to converge in this cyclic process, a value of the number K of sampling times in each round is adaptively reduced, which may effectively save computing resources while maintaining performance.

In addition, after step 104 is performed, steps 102 to 104 may be performed cyclically, to continuously update and optimize the sampling manner and the circuit parameter, to construct a better candidate quantum circuit. This cyclic process is stopped until a cycle termination condition is satisfied.

The cycle termination condition refers to a preset condition for triggering the cyclic process to be stopped. For example, the cycle termination condition includes, but is not limited to, at least one of the following: K candidate quantum circuits generated the last time are the same, the number of identical quantum circuits in the K candidate quantum circuits generated the last time is greater than a threshold, a performance evaluation index corresponding to the K candidate quantum circuits generated the last time meets a set index requirement, and the number of execution times in the cyclic process reaches a specified number, and the like, which is not limited in this embodiment of this disclosure.

Step 105. Determine a target quantum circuit from the K candidate quantum circuits generated the last time when the cycle termination condition is satisfied.

The target quantum circuit is a quantum circuit determined from the K candidate quantum circuits generated the last time. The target quantum circuit may be a quantum circuit selected from the K candidate quantum circuits generated the last time. In this embodiment of this disclosure, the target quantum circuit is a final constructed and generated quantum circuit for completing a predetermined quantum circuit design task.

In an exemplary embodiment, a candidate quantum circuit with the largest generation probability is determined from the K candidate quantum circuits generated the last time. The candidate quantum circuit with the largest generation probability is determined as a target quantum circuit. A generation probability of a candidate quantum circuit may be a proportion of the candidate quantum circuit in the K candidate quantum circuits. For example, the number of candidate quantum circuits generated the last time is 10, among which nine candidate quantum circuits (denoted by quantum circuit A) are the same, and the other one candidate quantum circuit (denoted by quantum circuit B) is different from the other nine. In this case, a generation probability of the quantum circuit A is 9/10=0.9, a generation probability of the quantum circuit B is 1/10=0.1, and the quantum circuit A may be selected as a final target quantum circuit.

To sum up, for different types of quantum circuit design problems, the technical solutions of this disclosure can be used to construct a target quantum circuit for resolving a corresponding problem, so that different types of quantum circuit design problems are highly abstracted and unified. The solutions have extremely strong universality and versatility.

In addition, compared with a genetic algorithm having disadvantages of large computational consumption and slow convergence, the technical solutions of this disclosure require only to determine a performance evaluation index corresponding to a candidate quantum circuit obtained by sampling, and update a sampling manner and a circuit unit in a circuit unit pool based on the performance evaluation index, thereby quickly constructing a candidate quantum circuit with better performance, which not only reduces computational workload, but also improves efficiency of determining a final target quantum circuit.

Figure 2:
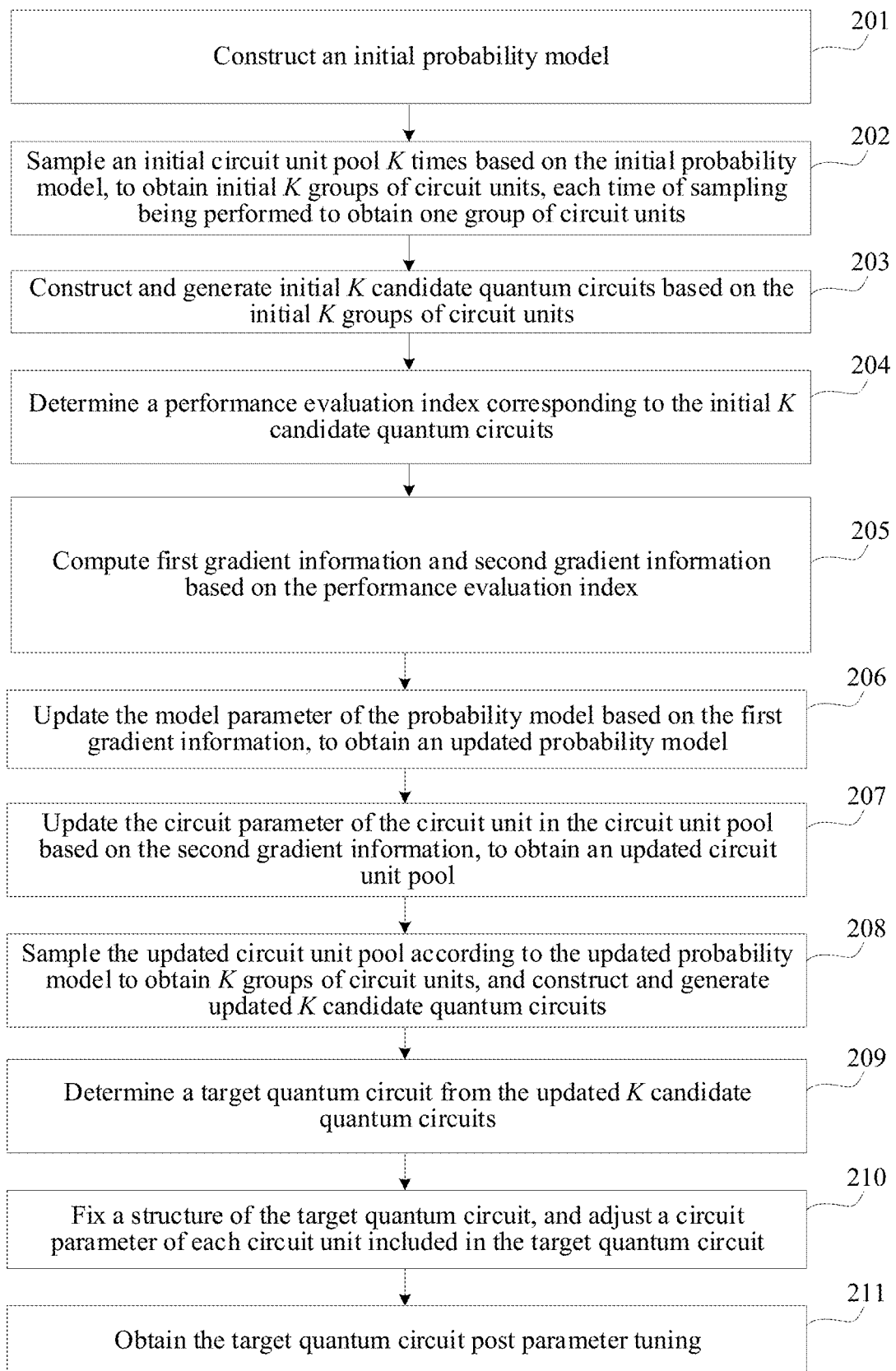
FIG. 2 is a flowchart of a method for determining a quantum circuit according to another embodiment of this disclosure.

FIG. 2 is a flowchart of a quantum circuit determining method according to another embodiment of this disclosure. An execution entity of steps of this method may be a computer device. The method may include the following steps (201 to 211):

Step 201. Construct an initial probability model, the probability model including p×c parameters, p representing a maximum number of circuit units, and c representing a total number of circuit units in a circuit unit pool.

In this embodiment of this disclosure, the probability model may be used as a sampling manner to sample a plurality of circuit units from the circuit unit pool. The probability model is a parameterized probability model, including p×c parameters, p representing a maximum number of circuit units, and c representing a total number of circuit units in the circuit unit pool.

The maximum number of circuit units refers to a maximum number of circuit units that may be included in a final constructed and generated target quantum circuit for completing a predetermined quantum circuit design task. For example, if the maximum number of circuit units is 6, an actual number of circuit units included in the final constructed and generated target quantum circuit needs to be less than or equal to 6. In this case, a group of circuit units obtained during each time of sampling may include six or less circuit units. In an example, the number of circuit units included in the target quantum circuit is a predetermined number. For example, if the number of circuit units included in the target quantum circuit is pre-defined to be 6, a group of circuit units obtained during each time of sampling includes six circuit units. In this case, the maximum number of circuit units is the predetermined number. The predetermined number may be determined according to the number of design layers of the target quantum circuit or the number of filling positions.

The circuit unit pool includes a plurality of circuit units. As described above, any quantum circuit may be regarded as being formed by stacking a series of unitary matrices. Therefore, the circuit unit pool may include equivalent circuits respectively corresponding to a plurality of unitary matrices. The circuit unit pool may also be referred to as an operator pool or another name, which is not limited in this embodiment of this disclosure.

In this embodiment of this disclosure, it is assumed that a model parameter of the probability model is $\alpha$, and $\alpha$ includes p×c parameters. For example, $\alpha$ may be regarded as a matrix of p rows×c columns. An element in an $i^{th}$ row and a $j^{th}$ column in the matrix represents a probability of filling a $j^{th}$ circuit unit in the circuit unit pool at an $i^{th}$ filling position of the target quantum circuit, i being a positive integer less than or equal to p, and j being a positive integer greater than or equal to c.

Step 202. Sample an initial circuit unit pool K times based on the initial probability model, to obtain K groups of circuit units, each time of sampling being performed to obtain one group of circuit units.

In each time of sampling process, a structural parameter k is generated based on the model parameter $\alpha$ of the probability model $P(k, \alpha)$. The structural parameter k may include a plurality of discrete values to represent the circuit unit obtained in this sampling. For example, the circuit unit pool includes five circuit units respectively numbered 0, 1, 2, 3, and 4, the structural parameter k includes (2, 1, 3), which means that a group of circuit units sampled from the circuit unit pool includes three circuit units numbered 2, 1, and 3 respectively. When the same model parameter $\alpha$ of the probability model $P(k, \alpha)$ is used, structural parameters k generated in any two times of sampling may be the same or different. For example, structural parameters k generated in two consecutive times of sampling are the same, both are (2, 1, 3). In another example, structural parameters k generated in two consecutive times of sampling are different, which are (2, 1, 3) and (2, 1, 4) respectively.

In addition, assuming that the number of circuit parameters of each circuit unit in the circuit unit pool is 1, a circuit parameter pool may be maintained. The circuit parameter pool includes a circuit parameter of each circuit unit in the circuit unit pool at each filling position, that is, the circuit parameter pool includes p×c×1 parameters.

Step 203. Construct and generate K candidate quantum circuits based on the K groups of circuit units.

For each group of circuit units obtained by sampling, a candidate quantum circuit is constructed and generated correspondingly. A connection relationship between the circuit units may be pre-defined or designed, which is not limited in this embodiment of this disclosure.

Step 204. Determine a performance evaluation index corresponding to the K candidate quantum circuits, the performance evaluation index being an operation result of an objective function.

The objective function is a mathematical function for computing whether a quantum circuit constructed and generated reaches a task optimization objective. For example, as described above, for different quantum circuit design tasks, different objective functions may be set correspondingly.

In this embodiment of this disclosure, it is assumed that a candidate quantum circuit constructed and generated based on a structural parameter k is U(k, θ), and an objective function corresponding to the candidate quantum circuit U(k, θ) is denoted by L(U(k, θ)), an objective function $\mathcal{L}$ corresponding to K candidate quantum circuits generated after K times of sampling may be expressed as follows:

$$\mathcal{L} = \sum_{k \sim P(k,\alpha)} L(U(k, \theta))$$

It can be seen from the above formula that operation results respectively corresponding to the K candidate quantum circuits with respect to the objective function are first computed, to obtain K operation results, and the performance evaluation index (that is, an operation result of the objective function $\mathcal{L}$) is then obtained based on the K operation results. The operation result of the objective function $\mathcal{L}$ reflects an overall situation or average situation of respective performance of the K candidate quantum circuits.

Step 205. Compute first gradient information and second gradient information based on the performance evaluation index, the first gradient information being gradient information of the model parameter of the probability model, and the second gradient information being gradient information of a circuit parameter of a circuit unit in the circuit unit pool.

In this embodiment of this disclosure, on the one hand, gradient information of the objective function relative to the model parameter of the probability model is computed, to obtain first gradient information, the first gradient information being used for guiding update of the model parameter of the probability model; on the other hand, gradient information of the objective function relative to a circuit parameter of a circuit unit in the circuit unit pool is computed, to obtain second gradient information, the second gradient information being used for guiding update of the circuit parameter of the circuit unit.

In an example, a derivative of the objective function relative to the model parameter of the probability model is computed, to obtain the first gradient information. For example, a derivative formula for computing the first gradient information is:

$$\nabla_\alpha \mathcal{L} = \sum_{k \sim P} \nabla_\alpha \ln P(k, \alpha) \ L(U(k, \theta)) - \sum_{k \sim P} L(U(k, \theta)) \sum_{k \sim P} \nabla_\alpha \ln P(k, \alpha)$$

where $\nabla_\alpha \mathcal{L}$ represents a derivative of the objective function $\mathcal{L}$ relative to the model parameter α. For other parameters in the formula, reference may be made to the description above.

In another example, a derivative of the objective function relative to the circuit parameter of the circuit unit in the circuit unit pool is computed, to obtain the second gradient information. For example, a derivative formula for computing the second gradient information is:

$$\nabla_\theta \mathcal{L} = \sum_{k \sim P(k,\alpha)} \nabla_\theta L(U(k, \theta))$$

where $\nabla_\theta \mathcal{L}$ represents a derivative of the objective function $\mathcal{L}$ relative to the circuit parameter θ. For other parameters in the formula, reference may be made to the description above.

In addition, when the first gradient information is computed through derivation, related techniques of Monte Carlo expected automatic differentiation may be used, including but not limited to a score function or a reparameterization method. For example, a solution using the score function is applicable to universal probability distribution models including an unnormalized one. When the second gradient information is computed through derivation, automatic differentiation may be used to obtain the derivative numerically. Experimentally, a derivative of a quantum circuit may be computed through parameter shift or direct measurement of the gradient quantum circuit.

Step 206. Update the model parameter of the probability model based on the first gradient information, to obtain an updated probability model.

For example, the model parameter α of the probability model is updated by using a gradient descent algorithm, to continuously optimize the model parameter α of the probability model, so as to obtain better circuit units by sampling for combination.

Step 207. Update the circuit parameter of the circuit unit in the circuit unit pool based on the second gradient information, to obtain an updated circuit unit pool.

For example, a circuit parameter θ of each circuit unit in the circuit unit pool is updated by using the gradient descent algorithm, to continuously optimize the circuit parameter θ of the each circuit unit, so as to optimize performance of a single circuit unit, to help improve overall performance of a constructed quantum circuit.

Step 208. Sample the updated circuit unit pool according to the updated probability model to obtain K groups of circuit units, and construct and generate K candidate quantum circuits.

Step 209. Determine a target quantum circuit from the K candidate quantum circuits generated the last time when a cycle termination condition is satisfied.

Step 208 and step 209 are the same as or similar to step 104 and step 105 in the embodiment of FIG. 1. For details, reference may be made to the descriptions in the foregoing embodiment.

The method provided in this embodiment of this disclosure further includes step 210 and step 211, to implement further tuning of a circuit parameter of a target quantum circuit.

Step 210. Fix a structure of the target quantum circuit, and adjust a circuit parameter of each circuit unit included in the target quantum circuit.

After the target quantum circuit is determined, a circuit structure (that is, circuit units included in the circuit and a connection relationship between the circuit units) of the target quantum circuit is fixed. If necessary, a circuit parameter of each circuit unit included in the target quantum circuit may be further tuned, to further improve performance of the target quantum circuit.

For example, gradient information of the objective function relative to the circuit parameter of the target quantum circuit is computed, and the gradient descent algorithm is also used to update the circuit parameter of the target quantum circuit, to continuously optimize the circuit parameter of the target quantum circuit to improve performance of the target quantum circuit.

Step 211. Obtain the target quantum circuit post parameter tuning when an adjustment termination condition is satisfied.

The adjustment termination condition refers to a preset condition for triggering adjustment of the circuit parameter of the target quantum circuit to be stopped. For example, the adjustment termination condition includes, but is not limited to, at least one of the following: a performance evaluation index of the target quantum circuit reaches a preset index, the number of adjustment times of the circuit parameter of the target quantum circuit reaches a specified number, and the like, which is not limited in this embodiment of this disclosure.

In this embodiment of this disclosure, the target quantum circuit post parameter tuning is a final constructed and generated quantum circuit for completing a predetermined quantum circuit design task.

In an exemplary embodiment, after the constructing and generating K candidate quantum circuits, the method further includes the following step: obtaining, for a $j^{th}$ circuit unit in an $i^{th}$ candidate quantum circuit, a circuit parameter of the $j^{th}$ circuit unit from a circuit parameter pool according to a position of the $j^{th}$ circuit unit in the circuit unit pool and a position of the $j^{th}$ circuit unit in the $i^{th}$ candidate quantum circuit, the circuit parameter pool including a circuit parameter of each circuit unit in the circuit unit pool at each filling position, i being a positive integer less than or equal to K, and j being a positive integer. The circuit parameter pool may include p×c groups of circuit parameters, an $(i, j)^{th}$ group of circuit parameters are circuit parameters when a $j^{th}$ circuit unit in the circuit unit pool is filled at an $i^{th}$ filling position, i being a positive integer less than or equal to p, and j being a positive integer greater than or equal to c.

In the foregoing manner, a parameter binding mechanism is used to bind a circuit parameter of a circuit unit to a filling position of the circuit unit, so that after a new candidate quantum circuit is constructed and generated, a circuit parameter of each circuit unit may be simply and efficiently obtained from the circuit parameter pool. In addition, when the circuit parameter of the each circuit unit in the circuit unit pool is updated based on the second gradient information, the circuit parameter stored in the circuit parameter pool needs to be synchronously updated, to ensure accuracy of the circuit parameter obtained from the circuit parameter pool.

In an exemplary embodiment, for a more stable training process, training techniques that have emerged in research of NAS and the broader field of machine learning may be introduced and developed, including but not limited to early stop, multi-start, circuit variational parameter warm-up training, separating a training verification data set to optimize two groups of parameters, post-processing of better training results and grid search, progressive layer-by-layer training, adding a moving average of an objective function as a baseline during Monte Carlo gradient estimation to reduce an estimation variance, adding random noise to circuit parameters to smooth energy loss, adding a regular term and a penalty term that support a plurality of objectives to the objective function, a smaller-scale agent task, transfer learning, and the like.

The more important one is the addition of the regular item. Because the model parameter of the probability model determines the sampling times and probability of each circuit unit, a corresponding regular item based on the model parameter may be defined, to encourage some types of circuit units (for example, a single-bit quantum gate), that is, to increase the sampling times and probabilities of the types of circuit units, or suppress some types of circuit units (for example, a two-bit quantum gate), that is, to reduce the sampling times and probabilities of the types of circuit units. For example, the following regular item is added to an objective function L, and the objective function L added with the regular item is expressed as ΔL:

$$\Delta L = \lambda \sum_{i=1}^{p} \sum_{k \in c} p(k_i = k) \times q$$

where c represents the number of circuit units in the circuit unit pool, p is the number of filling positions, $p(k_i=k)$ is a probability of filling a $k^{th}$ circuit unit at an $i^{th}$ candidate filling position, λ is a weight of the regular item, and q represents the number of two-bit quantum gates in the circuit units.

Such a manner of introducing a custom regular term improves flexibility and controllability of circuit unit sampling, thereby helping improve performance of the final constructed and generated quantum circuit and reduce a quantum noise level of the quantum circuit.

To sum up, in the technical solutions provided in the embodiments of this disclosure, a search domain of a quantum circuit is expanded to a continuous space, thereby making automatic differentiation and stochastic gradient descent possible, which greatly reduces consumption of computing resources, while ensuring better convergence.

In addition, in a process of parameter optimization, in this disclosure, the first gradient information and the second gradient information are computed, and the model parameter and the circuit parameter can be optimized based on the two types of gradient information, so that a multi-objective parameter optimization solution is realized, thereby helping improve efficiency of quantum circuit construction.

Figure 3:
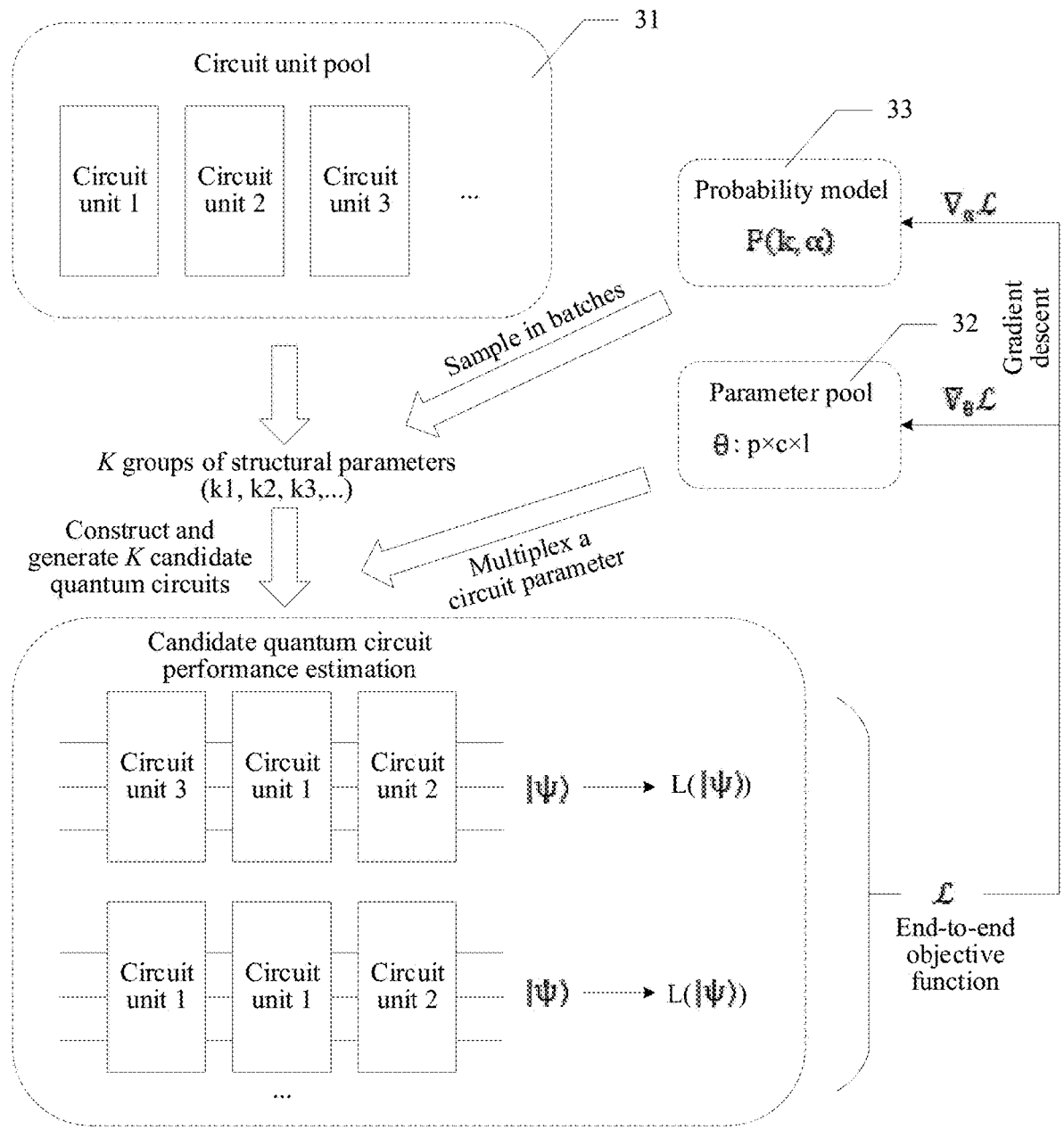
FIG. 3 is a schematic diagram of a differentiable quantum architecture search (DQAS) framework according to an embodiment of this disclosure.

The following describes, with reference to FIG. 3, a complete architecture of a DQAS framework according to an embodiment of this disclosure. It is assumed that a target quantum circuit for completing a predetermined quantum circuit design task is searched and constructed through the DQAS framework. A circuit unit pool 31 includes a plurality of selectable circuit units, such as circuit units 1, 2, and 3 shown in the figure. The circuit unit pool 31 is sampled based on a probability model P(k, α) 33 in batches to obtain K groups of circuit units, and K candidate quantum circuits are constructed and generated. A parameter pool 32 is configured to store a circuit parameter of a quantum circuit. A circuit parameter of each circuit unit in each candidate quantum circuit constructed and generated may be obtained from the parameter pool 32. In addition, performance of the candidate quantum circuits is evaluated by using an objective function L, and overall performance of the K candidate quantum circuits may be evaluated by using the objective function $\mathcal{L}$. Gradient information $\nabla_\alpha \mathcal{L}$ of the objective function $\mathcal{L}$ relative to a model parameter α of the probability model 33 and gradient information $\nabla_\theta \mathcal{L}$ of the objective function L relative to a circuit parameter θ of a circuit unit in the circuit unit pool 31 are computed, and the model parameter α and the circuit parameter θ are updated based on the two pieces of gradient information. Subsequently, the updated circuit unit pool is sampled according to the updated probability model to obtain K groups of circuit units, and K candidate quantum circuits are constructed and generated. The foregoing process is cyclically performed. When a cycle termination condition is satisfied, a candidate quantum circuit with the largest generation probability is selected, from K candidate quantum circuits generated the last time, as a final target quantum circuit.

FIG. 4 is a flowchart of a quantum circuit determining method according to another embodiment of this disclosure. An execution entity of steps of this method may be a computer device. The method may include the following steps (401 to 403):

Step 401. Select N circuit units from a circuit unit pool, the circuit unit pool including a plurality of circuit units, each circuit unit being an equivalent quantum circuit corresponding to a unitary matrix, and N being an integer greater than 1.

The circuit unit pool includes a plurality of selectable circuit units. In this embodiment of this disclosure, the circuit unit is a basic unit that forms a quantum circuit, and one quantum circuit may include one or more circuit units. When the quantum circuit includes a plurality of circuit units, a connection relationship between the circuit units may be pre-defined or designed. In an example, a quantum circuit has a multi-layer structure, each layer includes a circuit unit, and layers are connected in sequence. For example, an output result of a circuit unit of a layer may be used as input data of a circuit unit of a next layer, and the data is further computed or processed through the circuit unit of the next layer. In another example, a quantum circuit has a multi-layer structure, and each layer includes one or more filling positions for filling a circuit unit. When there are a plurality of filling positions in the same layer, the filling positions may be connected in advance in a preset manner.

For some basic operations that may be involved in a quantum computing task, a corresponding circuit unit is designed for each basic operation. For example, a circuit unit may be a single-bit quantum gate, a one-layer quantum gate, or a time-dependent evolution of a Hamiltonian, which is not limited in this embodiment of this disclosure.

In this embodiment of this disclosure, the quantum circuit is divided with a circuit unit as granularity, and one quantum circuit may be formed by a plurality of circuit units connected in a specific connection manner. Therefore, to construct a quantum circuit for completing a specific quantum computing task, a plurality of circuit units may be selected from the circuit unit pool.

In an implementation, according to a specific sampling manner, N circuit units are selected from the circuit unit pool. The sampling manner refers to a manner of selecting a circuit unit from the circuit unit pool. N circuit units are selected from the circuit unit pool during each time of sampling, and the N circuit units selected in one time of sampling form a group of circuit units, that is, each group of circuit units includes N circuit units. In addition, a circuit unit included in the N circuit units is repeatable. That is, the foregoing sampling process is performed in a replacement manner to ensure that each circuit unit may be reused in a final constructed quantum circuit.

In an exemplary embodiment, the sampling manner may be a probability model. For a manner of obtaining the circuit unit through sampling by using the probability model, reference may be made to the descriptions in the foregoing embodiment.

Step 402. Determine circuit parameters respectively corresponding to the N circuit units, the circuit parameter being used for defining an operation performed by the circuit unit, and the circuit parameter being updatable.

A circuit unit has a corresponding circuit parameter, and the circuit parameter is used for defining an operation performed by the circuit unit. That is, an operation performed by a circuit unit is not only related to a structure of the circuit unit, but also related to a circuit parameter of the circuit unit. After the N circuit units are selected from the circuit unit pool in step 401, a structure of each circuit unit is predetermined, and a circuit parameter of the each circuit unit is obtained by performing step 402.

In this embodiment of this disclosure, the circuit parameter of the circuit unit is a variational parameter, that is, the circuit parameter of the circuit unit is updatable (that is, adjustable and modifiable), so that if necessary, the circuit parameter of the circuit unit may be updated to improve performance of the circuit unit.

In an exemplary embodiment, a circuit parameter pool may be maintained. The circuit parameter pool includes a circuit parameter of each circuit unit in the circuit unit pool at each filling position. For an $i^{th}$ circuit unit in the N circuit units, a circuit parameter of the $i^{th}$ circuit unit is obtained from the circuit parameter pool according to a filling position of the $i^{th}$ circuit unit. In the foregoing manner, a parameter binding mechanism is used to bind a circuit parameter of a circuit unit to a filling position of the circuit unit, so that when a quantum circuit is constructed and generated, a circuit parameter of each circuit unit may be simply and efficiently obtained from the circuit parameter pool.

Step 403. Construct and generate a quantum circuit based on the N circuit units and the circuit parameters respectively corresponding to the N circuit units.

After the N circuit units and the circuit parameters respectively corresponding to the N circuit units are obtained, the quantum circuit is constructed and generated. The quantum circuit includes the N circuit units, and a circuit parameter of the quantum circuit includes the circuit parameters respectively corresponding to the N circuit units. In addition, a connection relationship between the circuit units may be pre-defined or designed, which is not limited in this embodiment of this disclosure.

In an exemplary embodiment, as shown in FIG. 5, the method further includes the following steps after step 403:

Step 404. Determine a performance evaluation index corresponding to the quantum circuit.

The performance evaluation index is a parameter for quantizing and evaluating performance of a quantum circuit. In an exemplary embodiment, the performance evaluation index is represented by using an objective function. The objective function is a mathematical function for computing whether a quantum circuit constructed and generated reaches a task optimization objective. For example, as described above, for different quantum circuit design tasks, different objective functions may be set correspondingly.

Step 405. Compute target gradient information based on the performance evaluation index, the target gradient information being gradient information of the circuit parameter of the quantum circuit.

In this embodiment of this disclosure, the target gradient information is obtained by computing gradient information of the objective function relative to the circuit parameter of the quantum circuit. The target gradient information is used for guiding update of the circuit parameter of the quantum circuit.

In an example, a derivative of the objective function relative to the circuit parameter of the quantum circuit is computed, to obtain the target gradient information. For example, a derivative formula for computing the target gradient information is:

$$\nabla_\theta L = \nabla_\theta L(U(k,\theta))$$

where $\nabla_\theta L$ represents a derivative of an objective function L relative to a circuit parameter $\theta$ of a quantum circuit $U(k, \theta)$.

Step 406. Update the circuit parameter of the quantum circuit based on the target gradient information, to obtain an updated quantum circuit.

For example, the circuit parameter of the quantum circuit is updated by using a gradient descent algorithm, to continuously optimize the circuit parameters of the circuit units, so as to improve overall performance of the quantum circuit.

In this embodiment of this disclosure, because the objective function is a differentiable function, corresponding gradient information may be computed through derivation, so that the circuit parameter can be updated and optimized by using the gradient descent algorithm, to continuously improve the performance of the quantum circuit.

To sum up, in the technical solutions provided in the embodiments of this disclosure, a quantum circuit is regarded as being formed by stacking equivalent quantum circuits corresponding to a series of unitary matrices, so that the quantum circuit is divided into circuit units. A circuit unit pool is constructed to provide selectable circuit units, and circuit units are selected from the circuit unit pool to construct a quantum circuit, thereby implementing DQAS, and providing a universal quantum circuit construction solution.

In addition, because a circuit parameter of each circuit unit included in the quantum circuit is updatable, performance of the quantum circuit can be improved by updating (that is, adjusting) the circuit parameter. Further, because an objective function corresponding to the quantum circuit is a differentiable function, corresponding gradient information may be computed through derivation, so that the circuit parameter can be updated and optimized by using the gradient descent algorithm, to continuously improve the performance of the quantum circuit.

In addition, compared with constructing a quantum circuit by using a genetic algorithm, which searches piecewise for a partial circuit structure locally optimal, thus leading to a problem that a final constructed complete quantum circuit is not globally optimal, this disclosure has better performance since a circuit parameter is updated after a complete quantum circuit structure is constructed, and a circuit parameter that achieves a complete quantum circuit globally optimal can be finally found.

For details not described in this embodiment, reference may be made to the descriptions in other embodiments above.

The following describes experiment cases in which a DQAS framework provided in this disclosure is applied to a specific quantum circuit design matter. Three types of matters are considered herein to show applications and prospects of the DQAS framework.

Case 1: Greenberger-Horne-Zeilinger (GHZ) quantum state preparation and Bell state circuit design.

In the following example, single-bit and two-bit quantum gates are adopted in an operator pool and a coding solution. Types of quantum gates and the number of qubit rows at which the quantum gates are located determine a constituent of the operator pool.

GHZ quantum state is defined as $$|GHZ_n\rangle = \frac{1}{\sqrt{2}}(|0^n\rangle + |1^n\rangle).$$

Figure 6:
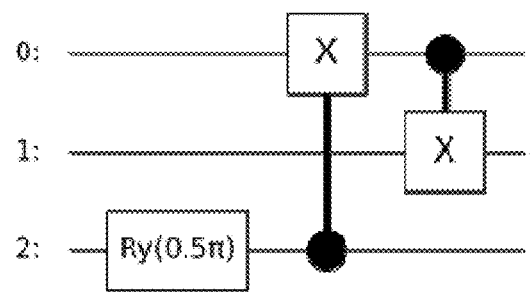
FIG. 6 to FIG. 12 are exemplary schematic diagrams of a plurality of quantum circuits constructed using a DQAS framework according to another embodiment of this disclosure.

Such a state is known as the Schrödinger's cat state, which is widely used in theory and quantum information practice. The DQAS framework provided in this disclosure can automatically design a corresponding quantum state preparation circuit. An objective function of the quantum state preparation circuit is an inner product of an output state of the quantum circuit and a theoretical GHZ state. Searching is performed by gradually reducing the number p of gates while ensuring performance, and it can be ensured that a preparation circuit that satisfies a condition and requires the least quantum gates is found. A specific circuit is shown in FIG. 6. A parameter $\pi/2$ is completely learned by the framework itself.

Figure 7:
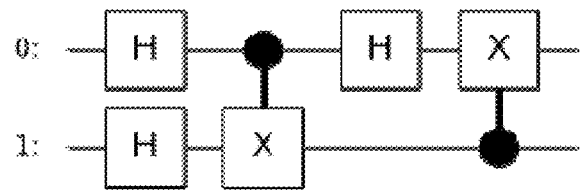
Figure 8:
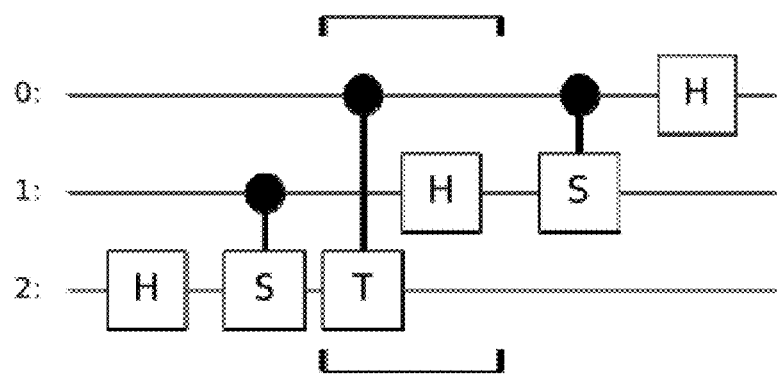
Figure 9:
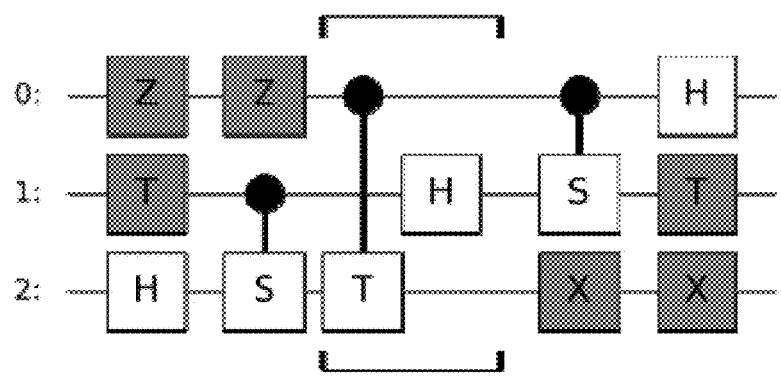
Figure 10:
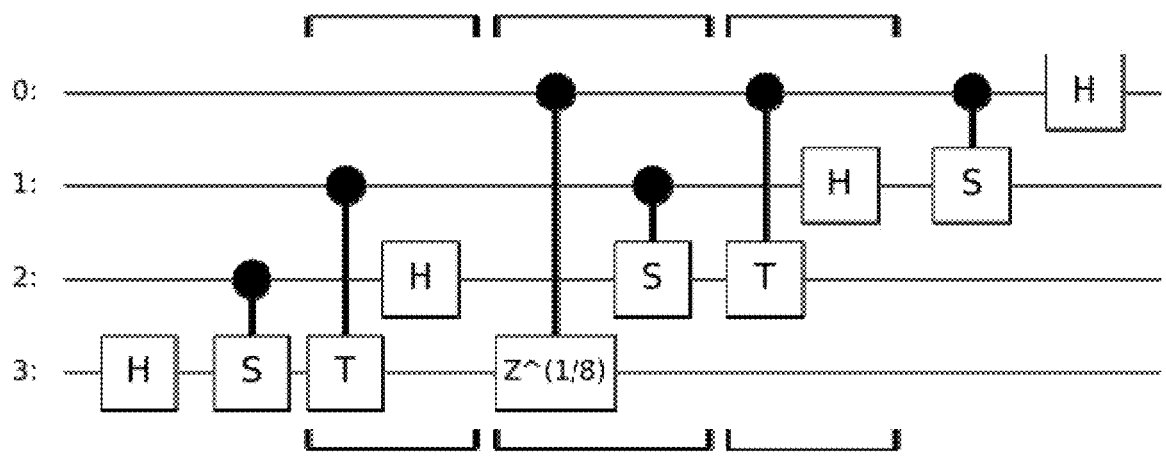
Figure 11:
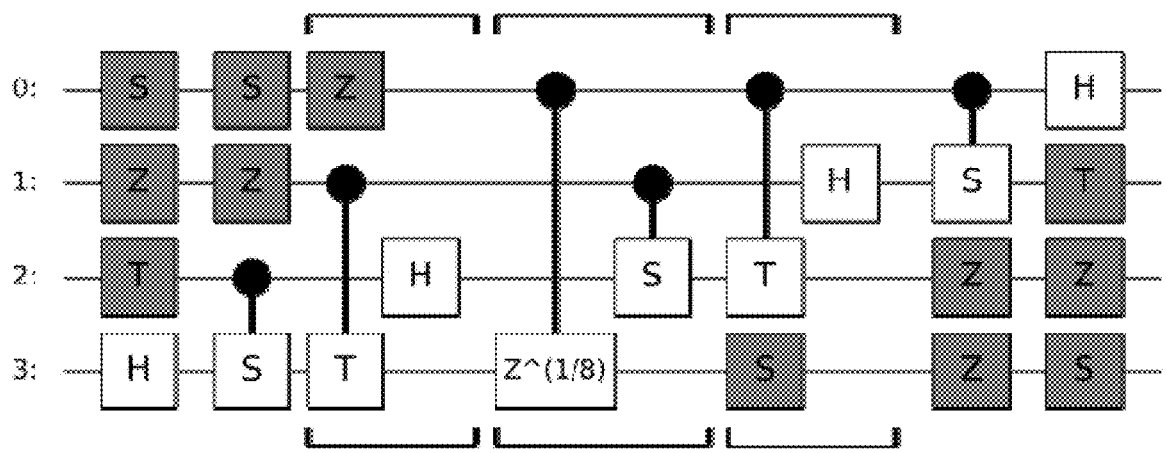

Bell state refers to four orthogonal entangled states formed by two bits, which play important roles in quantum teleportation and compression coding. A corresponding quantum circuit needs to respectively map four different measurement ground states to corresponding coded Bell state entangled states. Therefore, this matter is a complete circuit learning matter, rather than single quantum state preparation. An inner product of a target state and expectations of observations XX and ZZ may all be used as objective functions, and four different input state evaluations are required as a total objective function. A specific circuit obtained by automatic search is shown in FIG. 7. In this example, the framework uses only a discrete parameter-less operator pool, that is, a non-variable circuit parameter.

Case 2: Quantum Error Mitigation.

A circuit component of quantum Fourier transform and a hypothetical quantum noise model that often appear in quantum computing are used, to show a potential application of the DQAS solution in the field of quantum error correction. A quantum Fourier transform circuit is filled on 3-bit and 4-bit systems to improve fidelity of an output state.

A quantum error mitigation policy adopted herein is that a gap in a quantum circuit is filled with single-bit quantum gates, so that a set of the quantum gates provides an identity matrix. In this way, without changing a corresponding matrix of the quantum circuit, attenuation noise of a waiting bit may be effectively reduced, and coherent noise, which is more difficult to suppress, can be transformed into simple Pauli noise. In accordance with this policy, a circuit design coding solution adopted is an operator pool V formed by different types of single-bit gates and a placeholder U whose search depth p is equal to the number of gap positions in an original circuit. For example, for a 3-bit quantum Fourier transform circuit, p=6, and for a 4-bit circuit, p=12.

A comparison baseline of such an error correction effect is to try to fill quantum gates equivalent to 1 in corresponding consecutive gaps. It is found that this framework can find a circuit with higher fidelity than this knowledge-based common-sense solution. Actually, the DQAS can effectively perceive a specific long-range correlation in the quantum circuit, so that a single gap can also be filled non-identically to achieve a further improvement in fidelity.

Specifically, for the 3-bit quantum Fourier transform circuit, fidelity corresponding to the original circuit, an expert circuit, and a circuit automatically designed by the framework is 0.33, 0.55, and 0.6, respectively. For the 4-bit quantum Fourier transform circuit, fidelity corresponding to the original circuit, the expert circuit, and the circuit automatically designed by the framework is 0.13, 0.41, and 0.45, respectively. It may be seen that the error correction circuit designed automatically by this framework can suppress quantum noise better than a circuit designed by human experts. Such automatic circuit design does not depend on any prior knowledge at all, but is generated from scratch. (A corresponding quantum error correction design and a specific fidelity value depend on the hypothetical quantum noise model. The quantum noise model adopted in this example is: For a gap of each column of quantum gates, there is bit-flip noise of p=0.02, and for each quantum circuit vacancy, there is bit-flip noise of p=0.2)

For 3-bit and 4-bit original circuits, error correction circuits found in this framework are respectively shown in FIG. 8 to FIG. 11. A gray quantum gate in the error correction circuit is a result of intelligent filling after the DQAS framework is trained.

Case 3: QAOA-type circuit configuration search.

The QAOA is a very important quantum classical hybrid computing paradigm, and has a strong physical meaning and a strong connection with quantum annealing. Therefore, with the same depth and the same number of circuit parameters, finding a quantum circuit arrangement with stronger approximation capabilities has important application value (for showing quantum advantages) and theoretical significance (for cross-comparing and understanding with important concepts in quantum annealing). In such a matter, an end-to-end environment adopts a typical Max-Cut combinatorial optimization problem, and the operator pool adopts a policy of combining a Hamiltonian time-dependent evolution layer and an ordinary single-bit quantum gate layer. In the simplest case, an operator considered includes a Hadamard gate layer, single-bit x, y, z rotation layers (equivalent to $e^{iH\theta}$, where $H=\Sigma_i X_i$, and X may be replaced by a Y or Z operator), and $e^{i\Sigma_{ij}Z_iZ_j\theta}$ layer, ij representing an edge of a graph in the problem. The basic components are respectively referred to as an H-layer, an rx-layer, an ry-layer, an rz-layer, and a zz-layer. The xx-layer and the yy-layer may be constructed and generated by using the basic components, and therefore are redundant items. The setting of an end-to-end objective function is the same as that of a conventional QAOA, which is, an expectation, on an output state of a quantum circuit, of Max-Cut corresponding to a Hamiltonian.

Figure 12:
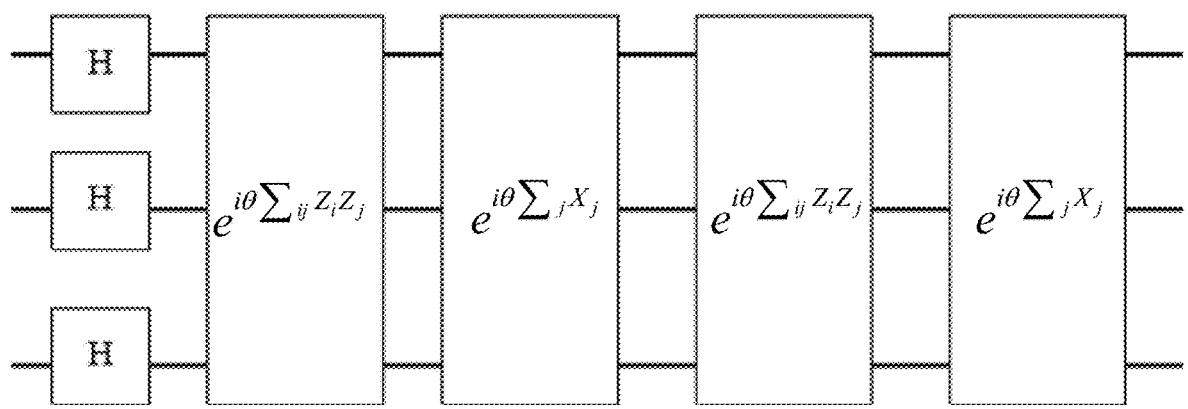

Through this framework, a configuration and corresponding parameters may be found, so that a corresponding quantum circuit structure may be simultaneously applied to a batch of graph instances generated from a specific distribution, for example, a regular graph. The quantum circuit structure found in this way is an optimal possible solution of approximating different graphs with the same solution. The same layout as the QAOA can be automatically found by search, that is, as shown in FIG. 12, an H-layer, a zz-layer, an rx-layer, a zz-layer, and an rx-layer. That is, in a case of a relatively wide scope of the graph and a relatively small number of layers, the framework shows that an alternate arrangement of the QAOA is indeed the best choice for approximation, which also shows that the framework has a specific theoretical exploration function in addition to strong applicability.

As shown above, the DQAS framework provided in this disclosure can be widely used in various quantum computing and quantum information problems, especially automated design of quantum circuits in various situations. Such end-to-end differentiable design does not depend on any hypothesis about a circuit structure, which brings many possibilities for quantum circuit design. In theory, this method combines new programming paradigms such as quantum programming, differential programming, and probabilistic programming, and can be used to explore and find a potentially efficient quantum structure beyond accumulation of existing knowledge. In practice, this framework has good performance and excellent results in quantum state preparation, quantum circuit decomposition and compilation, quantum error correction, and variable quantum structure search. The differentiable methodology and high versatility of the framework ensure that the solution is simple and efficient, while allowing for account native quantum gates of real quantum hardware, connection topologies, noise features, and the like.

Specifically, empirical examples can indicate that the DQAS framework provided in this disclosure can achieve the following contents and effects:

1. A multi-bit GHZ quantum state preparation circuit is automatically designed.

2. Discrete gate decomposition of a given quantum circuit is automatically implemented, and design of a Bell state mapping circuit is completed.

3. Quantum error mitigation is implemented on a quantum Fourier transform circuit, and an error correction policy that surpasses experience of existing experts is found.

4. A hypothesis that a QAOA arrangement structure is used as a quantum circuit solution is spontaneously found only through an environment of a Max-Cut combinatorial optimization problem, and in a specific problem, a Hamiltonian sub-block arrangement with better performance can be found by search.

Generally, the technical solutions provided in this disclosure has the following advantages over other solutions:

1. Versatility: For the first time, the important problem of quantum structure search is completely summarized and abstracted, and a completely universal end-to-end solution is proposed.

2. Computational efficiency: The solution is the first differentiable automatic quantum circuit design solution, which consumes fewer computing resources such as time and hardware to obtain results similar to or significantly better than other solutions.

3. Multi-objective: The solution can simultaneously optimize a plurality of objectives, making hardware friendly, and considering quantum error correction to be better embedded in an overall framework.

4. Results beyond existing knowledge and experience: The application of the framework to a specific quantum computing matter does not depend on hypotheses of any field-specific knowledge, but merely depends on machine learning to achieve a series of results that meet or exceed accumulation of existing knowledge, showing high potential of the solution.

The technical solutions of this disclosure are helpful to speed up design of a more adaptable quantum circuit at present. Typical shortcomings of quantum hardware in the NISQ era are short coherence time and large quantum noise. Correspondingly, in addition to fully considering a specific feature of the quantum hardware, a depth of the quantum circuit and the number of two-bit quantum gates need to be reduced to the greatest extent. Because the two-bit quantum gate usually has greater noise than a single-bit quantum gate, reducing the number of two-bit quantum gates while ensuring performance can effectively alleviate impact of quantum noise. The DQAS framework provided in this disclosure can well resolve this multi-objective circuit design problem, thereby obtaining advantages in commercial application of quantum computing.

In addition, quantum hardware evaluation may be applied in a short to medium time. Applications in actual production include a VQE or QAOA hypothesis optimization assisted by DQAS, which helps to use fewer quantum resources to obtain better results, and corresponding products can be used to resolve a combinatorial optimization problem or a ground state energy simulation in quantum chemistry. In addition, the DQAS can also effectively exert design potential in a quantum compilation technology stack and quantum error mitigation, making a corresponding circuit more stable to quantum noise.

The following describes apparatus embodiments of this disclosure, which can be used to execute the method embodiments of this disclosure. For details not disclosed in the apparatus embodiments of this disclosure, refer to the method embodiments of this disclosure.

Figure 13:
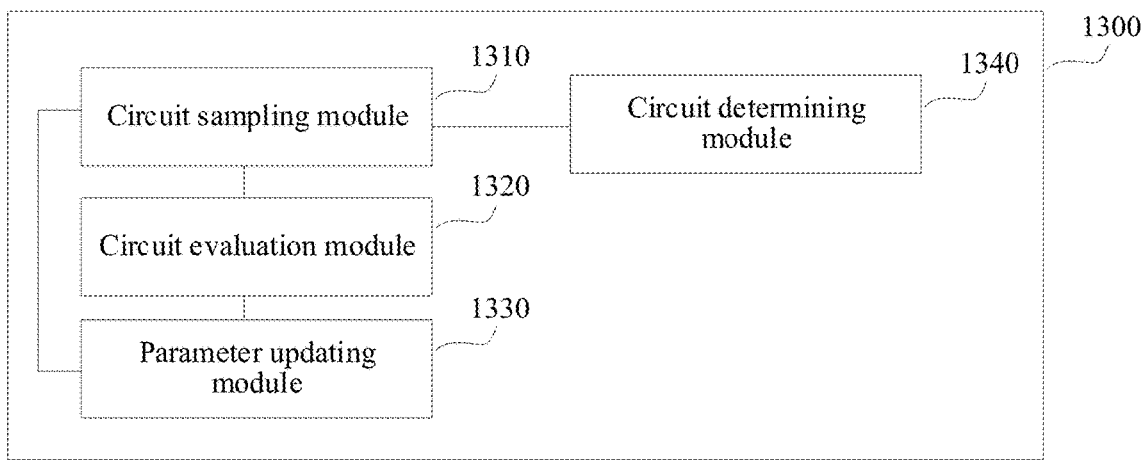
FIG. 13 is a block diagram of an apparatus for determining a quantum circuit according to an embodiment of this disclosure.

FIG. 13 is a block diagram of a quantum circuit determining apparatus according to an embodiment of this disclosure. The apparatus has functions of implementing the foregoing method embodiments. The functions may be implemented by hardware, or may be implemented by hardware executing corresponding software. The apparatus may be the computer device described above, or may be disposed in the computer device. As shown in FIG. 13, the apparatus 1300 may include: a circuit sampling module 1310, a circuit evaluation module 1320, a parameter updating module 1330, and a circuit determining module 1340.

The term module (and other similar terms such as unit, submodule, etc.) may refer to a software module, a hardware module, or a combination thereof. A software module (e.g., computer program) may be developed using a computer programming language. A hardware module may be implemented using processing circuitry and/or memory. Each module can be implemented using one or more processors (or processors and memory). Likewise, a processor (or processors and memory) can be used to implement one or more modules. Moreover, each module can be part of an overall module that includes the functionalities of the module. A module is configured to perform functions and achieve goals such as those described in this disclosure, and may work together with other related modules, programs, and components to achieve those functions and goals.

The circuit sampling module 1310 is configured to sample an initial circuit unit pool according to an initial sampling manner to obtain K groups of circuit units, and construct and generate K candidate quantum circuits, each group of circuit units including at least one circuit unit for constructing and generating a candidate quantum circuit, and K being a positive integer.

The circuit evaluation module 1320 is configured to determine a performance evaluation index corresponding to the K candidate quantum circuits.

The parameter updating module 1330 is configured to update the sampling manner and a circuit unit in the circuit unit pool based on the performance evaluation index, to obtain an updated sampling manner and an updated circuit unit pool.

The circuit sampling module 1310 is further configured to sample the updated circuit unit pool according to the updated sampling manner to obtain K groups of circuit units, and construct and generate K candidate quantum circuits.

The circuit determining module 1340 is configured to determine a target quantum circuit from the K candidate quantum circuits generated the last time when a cycle termination condition is satisfied.

Figure 14:
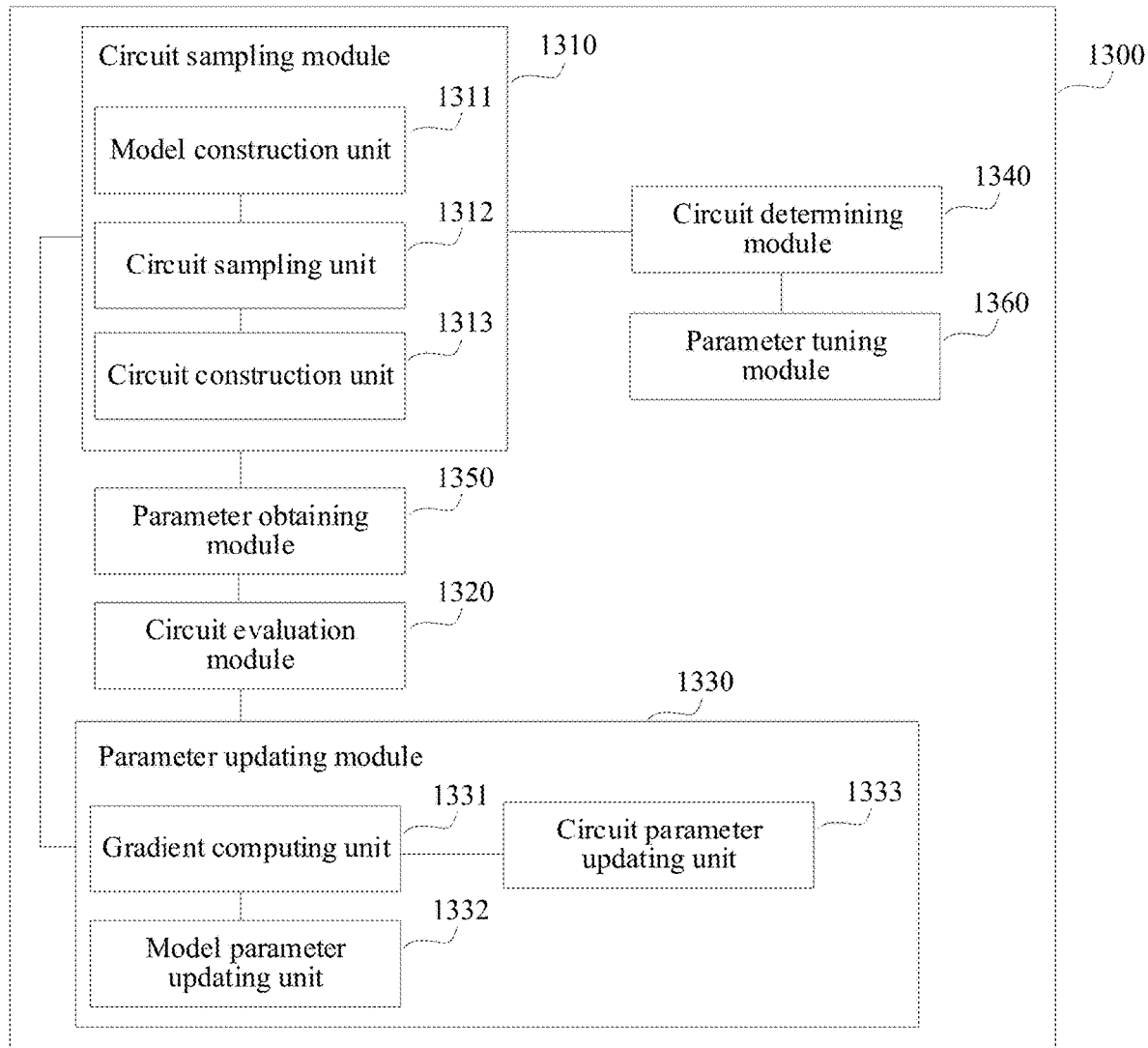
FIG. 14 is a block diagram of an apparatus for determining a quantum circuit according to another embodiment of this disclosure.

In an exemplary embodiment, as shown in FIG. 14, the circuit sampling module 1310 includes: a model construction unit 1311, a circuit sampling unit 1312, and a circuit construction unit 1313.

The model construction unit 1311 is configured to construct an initial probability model, the probability model including p×c parameters, p representing a maximum number of circuit units, and c representing a total number of circuit units in the circuit unit pool.

The circuit sampling unit 1312 is configured to sample the initial circuit unit pool K times based on the initial probability model, to obtain the K groups of circuit units, each time of sampling being performed to obtain one group of circuit units.

The circuit construction unit 1313 is configured to construct and generate the K candidate quantum circuits based on the K groups of circuit units.

In an exemplary embodiment, as shown in FIG. 14, the parameter updating module 1330 includes: a gradient computing unit 1331, a model parameter updating unit 1332, and a circuit parameter updating unit 1333.

The gradient computing unit 1331 is configured to compute first gradient information and second gradient information based on the performance evaluation index, the first gradient information being gradient information of a model parameter of the probability model, and the second gradient information being gradient information of a circuit parameter of the circuit unit in the circuit unit pool.

The model parameter updating unit 1332 is configured to update the model parameter of the probability model based on the first gradient information, to obtain an updated probability model.

The circuit parameter updating unit 1333 is configured to update the circuit parameter of the circuit unit in the circuit unit pool based on the second gradient information, to obtain an updated circuit unit pool.

In an exemplary embodiment, the performance evaluation index is an operation result of an objective function. The gradient computing unit 1331 is configured to compute a derivative of the objective function relative to the model parameter of the probability model, to obtain the first gradient information; and compute a derivative of the objective function relative to the circuit parameter of the circuit unit in the circuit unit pool, to obtain the second gradient information.

In an exemplary embodiment, the performance evaluation index is an operation result of an objective function. The circuit evaluation module 1320 is configured to compute operation results of the K candidate quantum circuits respectively corresponding to the objective function, to obtain K operation results; and obtain the performance evaluation index based on the K operation results.

In an exemplary embodiment, the circuit determining module 1340 is configured to determine a candidate quantum circuit with the largest generation probability from the K candidate quantum circuits generated the last time; and determine the candidate quantum circuit with the largest generation probability as the target quantum circuit.

In an exemplary embodiment, as shown in FIG. 14, the apparatus 1300 further includes: a parameter obtaining module 1350, configured to obtain, for at circuit unit in an $i^{th}$ candidate quantum circuit, a circuit parameter of the $j^{th}$ circuit unit from a circuit parameter pool according to a position of the $j^{th}$ circuit unit in the circuit unit pool and a position of the $j^{th}$ circuit unit in the $i^{th}$ candidate quantum circuit. The circuit parameter pool includes a circuit parameter of each circuit unit in the circuit unit pool at each filling position, i is a positive integer less than or equal to K, and j is a positive integer.

In an exemplary embodiment, as shown in FIG. 14, the apparatus 1300 further includes: a parameter tuning module 1360, configured to fix a structure of the target quantum circuit, and adjust a circuit parameter of each circuit unit included in the target quantum circuit; and obtain the target quantum circuit post parameter tuning when an adjustment termination condition is satisfied.

In an exemplary embodiment, a circuit unit included in each group of circuit units is repeatable.

To sum up, for different types of quantum circuit design problems, the technical solutions of this disclosure can be used to construct a target quantum circuit for resolving a corresponding problem, so that different types of quantum circuit design problems are highly abstracted and unified. The solutions have extremely strong universality and versatility.

In addition, compared with a genetic algorithm having disadvantages of large computational consumption and slow convergence, the technical solutions of this disclosure require only to determine a performance evaluation index corresponding to a candidate quantum circuit obtained by sampling, and update a sampling manner and a circuit unit in a circuit unit pool based on the performance evaluation index, thereby quickly constructing a candidate quantum circuit with better performance, which not only reduces computational workload, but also improves efficiency of determining a final target quantum circuit.

Figure 15:
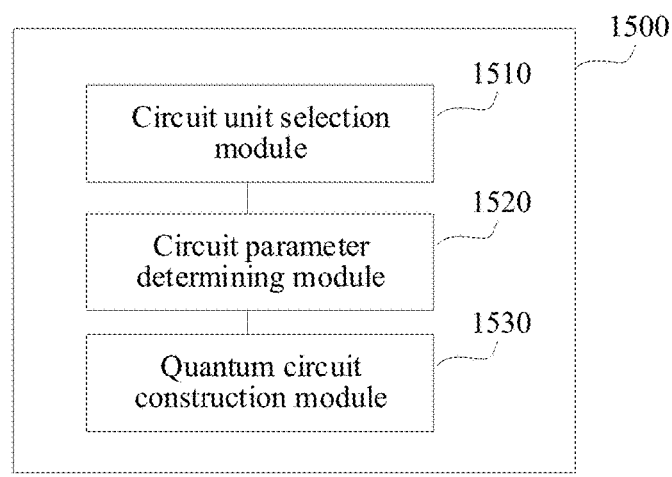
FIG. 15 is a block diagram of an apparatus for determining a quantum circuit according to another embodiment of this disclosure.

FIG. 15 is a block diagram of a quantum circuit determining apparatus according to another embodiment of this disclosure. The apparatus has functions of implementing the foregoing method embodiments. The functions may be implemented by hardware, or may be implemented by hardware executing corresponding software. The apparatus may be the computer device described above, or may be disposed in the computer device. As shown in FIG. 15, the apparatus 1500 may include: a circuit unit selection module 1510, a circuit parameter determining module 1520, and a quantum circuit construction module 1530.

The circuit unit selection module 1510 is configured to select N circuit units from a circuit unit pool, the circuit unit pool including a plurality of circuit units, each circuit unit being an equivalent quantum circuit corresponding to a unitary matrix, and N being an integer greater than 1.

The circuit parameter determining module 1520 is configured to determine circuit parameters respectively corresponding to the N circuit units, the circuit parameter being used for defining an operation performed by the circuit unit, and the circuit parameter being updatable.

The quantum circuit construction module 1530 is configured to construct and generate a quantum circuit based on the N circuit units and the circuit parameters respectively corresponding to the N circuit units.

In an exemplary embodiment, the circuit parameter determining module 1520 is configured to obtain, for an $i^{th}$ circuit unit in the N circuit units, a circuit parameter of the $i^{th}$ circuit unit from a circuit parameter pool according to a filling position of the $i^{th}$ circuit unit, the circuit parameter pool including a circuit parameter of each circuit unit in the circuit unit pool at each filling position, i being a positive integer less than or equal to N.

Figure 16:
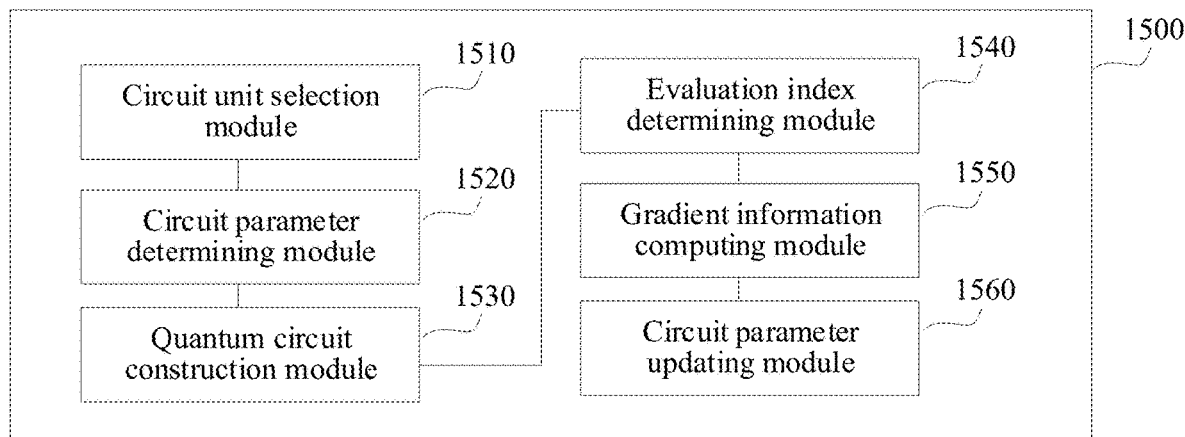
FIG. 16 is a block diagram of an apparatus for determining a quantum circuit according to another embodiment of this disclosure.

In an exemplary embodiment, as shown in FIG. 16, the apparatus 1500 further includes an evaluation index determining module 1540, a gradient information computing module 1550, and a circuit parameter updating module 1560.

The evaluation index determining module 1540 is configured to determine a performance evaluation index corresponding to the quantum circuit.

The gradient information computing module 1550 is configured to compute target gradient information based on the performance evaluation index, the target gradient information being gradient information of a circuit parameter of the quantum circuit.

The circuit parameter updating module 1560 is configured to update the circuit parameter of the quantum circuit based on the target gradient information, to obtain an updated quantum circuit.

In an exemplary embodiment, the performance evaluation index is an operation result of an objective function. The gradient information computing module 1550 is configured to compute a derivative of the objective function relative to the circuit parameter of the quantum circuit, to obtain the target gradient information.

In an exemplary embodiment, a circuit unit included in the N circuit units is repeatable.

To sum up, in the technical solutions provided in the embodiments of this disclosure, a quantum circuit is regarded as being formed by stacking equivalent quantum circuits corresponding to a series of unitary matrices, so that the quantum circuit is divided into circuit units. A circuit unit pool is constructed to provide selectable circuit units, and circuit units are selected from the circuit unit pool to construct a quantum circuit, thereby implementing DQAS, and providing a universal quantum circuit construction solution.

When the apparatus provided in the foregoing embodiments implements its functions, a description is given only by using the foregoing division of functional modules as an example. In actual applications, the functions may be allocated to and implemented by different functional modules according to the requirements, that is, the internal structure of the device may be divided into different functional modules, to implement all or some of the functions described above. In addition, the apparatus provided in the foregoing embodiment belongs to the same conception as the embodiment of the method. For a specific implementation process thereof, reference may be made to the method embodiment.

Figure 17:
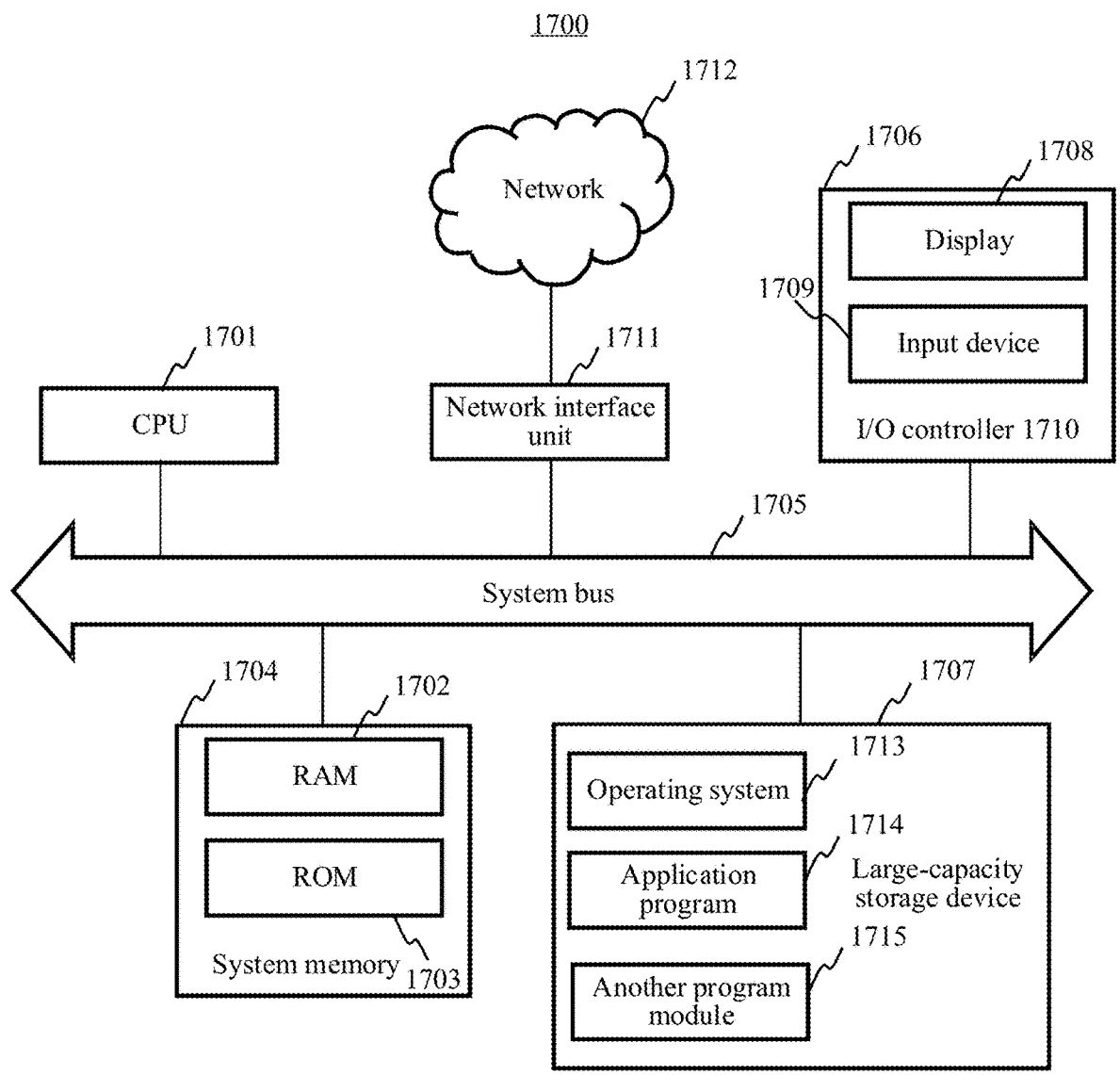
FIG. 17 is a block diagram of a computer device according to an embodiment of this disclosure.

FIG. 17 is a structural block diagram of a computer device according to an embodiment of this disclosure. The computer device may be configured to implement the quantum circuit determining method provided in the foregoing embodiments. For example, the computer device is a classical computer.

The computer device 1700 includes a processing unit (for example, a central processing unit (CPU), a graphics processing unit (GPU), and a field-programmable gate array (FPGA) 1701, a system memory 1704 including a random access memory (RAM) 1702 and a read-only memory (ROM) 1703, and a system bus 1705 connecting the system memory 1704 and the CPU 1701. The computer device 1700 further includes a basic input/output system (I/O system)

1706 for information transmission between components in the computer device, and a large-capacity storage device 1707 for storing an operating system 1713, an application program 1714, and another program module 1715.

The basic I/O system 1706 includes a display 1708 configured to display information and an input device 1709, such as a mouse or a keyboard, for a user to input information. The display 1708 and the input device 1709 are both connected to the CPU 1701 by using an input/output controller 1710 connected to the system bus 1705. The basic I/O system 1706 may further include the I/O controller 1710 configured to receive and process inputs from a plurality of other devices such as a keyboard, a mouse, or an electronic stylus. Similarly, the input/output controller 1710 further provides an output to a display screen, a printer, or other type of output device.

The large-capacity storage device 1707 is connected to the CPU 1701 by using a mass storage controller (not shown) connected to the system bus 1705. The large-capacity storage device 1707 and an associated computer-readable medium thereof provide non-volatile storage for the computer device 1700. That is, the large-capacity storage device 1707 may include a computer-readable medium (not shown) such as a hard disk or a compact disc ROM (CD-ROM) drive.

Without loss of generality, the computer-readable medium may include a computer storage medium and a communication medium. The computer storage medium includes volatile and non-volatile, removable and non-removable media implemented by using any method or technology for storing information such as computer-readable instructions, data structures, program modules, or other data. The computer storage medium includes a RAM, a ROM, an erasable programmable ROM (EPROM), an electrically erasable programmable ROM (EEPROM), a flash memory or another solid-state memory technology, a CD-ROM, a digital versatile disc (DVD) or another optical memory, a tape cartridge, a magnetic cassette, a magnetic disk memory, or another magnetic storage device. Certainly, a person skilled in the art can know that the computer storage medium is not limited to the foregoing types. The system memory 1704 and the large-capacity storage device 1707 may be generally referred to as a memory.

According to the embodiments of this disclosure, the computer device 1700 may be further connected, through a network such as the Internet, to a remote computer on the network and run. That is, the computer device 1700 may be connected to a network 1712 by using a network interface unit 1711 connected to the system bus 1705, or may be connected to another type of network or a remote computer system (not shown) by using a network interface unit 1711.

The memory further includes at least one instruction, at least one program, a code set, or an instruction set, the at least one instruction, the at least one program, the code set, or the instruction set being stored in the memory and configured to be executed by one or more processors to implement the foregoing quantum circuit determining method.

In an exemplary embodiment, a computer-readable storage medium is further provided, the storage medium storing at least one instruction, at least one program, a code set, or an instruction set, the at least one instruction, the at least one program, the code set, or the instruction set, when executed by the processor, implementing the foregoing quantum circuit determining method.

The computer-readable storage medium may be a ROM, a RAM, a compact disc ROM (CD-ROM), a magnetic tape, a solid state drive (SSD), an optical disc, or the like. The RAM may include a resistance random access memory (ReRAM) and a dynamic random access memory (DRAM).

In an exemplary embodiment, a computer program product or a computer program is provided. The computer program product or the computer program includes computer instructions, and the computer instructions are stored in a computer-readable storage medium. A processor of a computer device reads the computer instructions from the computer-readable storage medium and executes the computer instructions to cause the computer device to perform the foregoing quantum circuit determining method.

It is to be understood that the term "a/the plurality of" mentioned in this specification means two or more. The terms "and/or" describes an association relationship between associated objects and represents that three relationships may exist. For example, A and/or B may represent the following three cases: only A exists, both A and B exist, and only B exists. The character "/" generally indicates an "or" relationship between the associated objects. In addition, the step numbers described in this specification merely exemplarily show a possible execution sequence of the steps. In some other embodiments, the steps may not be performed according to the number sequence. For example, two steps with different numbers may be performed simultaneously, or two steps with different numbers may be performed according to a sequence contrary to the sequence shown in the figure. This is not limited in the embodiments of this disclosure.

The foregoing descriptions are merely exemplary embodiments of this disclosure, but are not intended to limit this disclosure. Any modification, equivalent replacement, or improvement made within the spirit and principle of this disclosure shall fall within the protection scope of this disclosure.

What is claimed is:

1. A method for determining a quantum circuit, comprising:
    sampling an initial circuit unit pool according to an initial sampling manner to obtain initial K groups of circuit units;
    constructing and generating initial K candidate quantum circuits based on the initial K groups of circuit units, each group of the circuit units comprising at least one circuit unit for constructing and generating a candidate quantum circuit, and K being a positive integer;
    determining a performance evaluation index corresponding to the initial K candidate quantum circuits;
    updating the initial sampling manner and a circuit unit in the initial circuit unit pool based on the performance evaluation index, to obtain an updated sampling manner and an updated circuit unit pool;
    sampling the updated circuit unit pool according to the updated sampling manner to obtain updated K groups of circuit units;
    constructing and generating updated K candidate quantum circuits based on the updated K groups of circuit units; and
    in response to a cycle termination condition being satisfied, determining a target quantum circuit from the updated K candidate quantum circuits.

2. The method according to claim 1, wherein the sampling the initial circuit unit pool comprises:
    constructing an initial probability model, the probability model comprising p×c parameters, p representing a maximum number of circuit units, and c representing a total number of circuit units in the initial circuit unit pool; and sampling the initial circuit unit pool K times based on the initial probability model, to obtain the initial K groups of circuit units, each time of sampling being performed to obtain one group of circuit units.

3. The method according to claim 2, wherein the updating the sampling manner and the circuit unit in the initial circuit unit pool comprises:

computing first gradient information and second gradient information based on the performance evaluation index, the first gradient information being gradient information of a model parameter of the initial probability model, and the second gradient information being gradient information of a circuit parameter of the circuit unit in the circuit unit pool;

updating the model parameter of the initial probability model based on the first gradient information, to obtain the updated probability model; and updating the circuit parameter of the circuit unit in the circuit unit pool based on the second gradient information, to obtain the updated circuit unit pool.

4. The method according to claim 3, wherein the performance evaluation index is an operation result of an objective function, and the computing the first gradient information and the second gradient information based on the performance evaluation index comprises:

computing a derivative of the objective function relative to the model parameter of the initial probability model, to obtain the first gradient information; and computing a derivative of the objective function relative to the circuit parameter of the circuit unit in the circuit unit pool, to obtain the second gradient information.

5. The method according to claim 1, wherein the performance evaluation index is an operation result of an objective function, and the determining the performance evaluation index corresponding to the initial K candidate quantum circuits comprises:

computing K operation results of the objective function respectively corresponding to the K candidate quantum circuits; and obtaining the performance evaluation index based on the K operation results.

6. The method according to claim 1, wherein the determining the target quantum circuit from the updated K candidate quantum circuits comprises:

determining a candidate quantum circuit with a largest generation probability from the updated K candidate quantum circuits; and determining the candidate quantum circuit as the target quantum circuit.

7. The method according to claim 1, wherein the method further comprises:

obtaining, for a $j^{th}$ circuit unit in an $i^{th}$ candidate quantum circuit, a circuit parameter of the $j^{th}$ circuit unit from a circuit parameter pool according to a position of the $j^{th}$ circuit unit in the circuit unit pool and a position of the $j^{th}$ circuit unit in the $i^{th}$ candidate quantum circuit, the circuit parameter pool comprising a circuit parameter of each circuit unit in the circuit unit pool at each filling position, i being a positive integer less than or equal to K, and j being a positive integer.

8. The method according to claim 1, wherein the method further comprises:

fixing a structure of the target quantum circuit, and adjusting a circuit parameter of each circuit unit in the target quantum circuit; and in response to an adjustment termination condition being satisfied, obtaining the target quantum circuit post parameter tuning.

9. The method according to claim 1, wherein a circuit unit is repeatable in each group of circuit units.

10. A method for determining quantum circuit, comprising:

selecting N circuit units from a circuit unit pool, the circuit unit pool comprising a plurality of circuit units, each circuit unit being an equivalent quantum circuit corresponding to a unitary matrix, and N being an integer greater than 1;

determining circuit parameters respectively corresponding to the N circuit units, the circuit parameter being for defining an operation performed by the circuit unit, and the circuit parameter being updatable; and constructing and generating a quantum circuit based on the N circuit units and the circuit parameters respectively corresponding to the N circuit units.

11. The method according to claim 10, wherein the determining the circuit parameters respectively corresponding to the N circuit units comprises:

obtaining, for an $i^{th}$ circuit unit in the N circuit units, a circuit parameter of the $i^{th}$ circuit unit from a circuit parameter pool according to a filling position of the $i^{th}$ circuit unit, the circuit parameter pool comprising a circuit parameter of each circuit unit in the circuit unit pool at each filling position, i being a positive integer less than or equal to N.

12. The method according to claim 10, wherein the method further comprises:

determining a performance evaluation index corresponding to the quantum circuit;

computing target gradient information based on the performance evaluation index, the target gradient information being gradient information of a circuit parameter of the quantum circuit; and updating the circuit parameter of the quantum circuit based on the target gradient information, to obtain an updated quantum circuit.

13. The method according to claim 12, wherein the performance evaluation index is an operation result of an objective function, and the computing the target gradient information based on the performance evaluation index comprises:

computing a derivative of the objective function relative to the circuit parameter of the quantum circuit, to obtain the target gradient information.

14. The method according to claim 10, wherein a circuit unit is repeatable in the N circuit units.

15. An apparatus for determining a quantum circuit, comprising:

a memory operable to store computer-readable instructions; and a processor circuitry operable to read the computer-readable instructions, the processor circuitry when executing the computer-readable instructions is configured to:

sample an initial circuit unit pool according to an initial sampling manner to obtain initial K groups of circuit units;

construct and generate initial K candidate quantum circuits based on the initial K groups of circuit units, each group of the circuit units comprising at least one circuit unit for constructing and generating a candidate quantum circuit, and K being a positive integer;

determine a performance evaluation index corresponding to the initial K candidate quantum circuits;

update the initial sampling manner and a circuit unit in the initial circuit unit pool based on the performance evaluation index, to obtain an updated sampling manner and an updated circuit unit pool;

sample the updated circuit unit pool according to the updated sampling manner to obtain updated K groups of circuit units;

construct and generate updated K candidate quantum circuits based on the updated K groups of circuit units; and in response to a cycle termination condition being satisfied, determine a target quantum circuit from the updated K candidate quantum circuits.

16. The apparatus according to claim 15, wherein the processor circuitry is configured to:

construct an initial probability model, the probability model comprising p×c parameters, p representing a maximum number of circuit units, and c representing a total number of circuit units in the initial circuit unit pool; and sample the initial circuit unit pool K times based on the initial probability model, to obtain the initial K groups of circuit units, each time of sampling being performed to obtain one group of circuit units.

17. The apparatus according to claim 16, wherein the processor circuitry is configured to:

compute first gradient information and second gradient information based on the performance evaluation index, the first gradient information being gradient information of a model parameter of the initial probability model, and the second gradient information being gradient information of a circuit parameter of the circuit unit in the circuit unit pool;

update the model parameter of the initial probability model based on the first gradient information, to obtain the updated probability model; and update the circuit parameter of the circuit unit in the circuit unit pool based on the second gradient information, to obtain the updated circuit unit pool.

18. The apparatus according to claim 17, wherein the performance evaluation index is an operation result of an objective function, and the processor circuitry is configured to:

compute a derivative of the objective function relative to the model parameter of the initial probability model, to obtain the first gradient information; and compute a derivative of the objective function relative to the circuit parameter of the circuit unit in the circuit unit pool, to obtain the second gradient information.

19. The apparatus according to claim 15, wherein the performance evaluation index is an operation result of an objective function, and the processor circuitry is configured to:

compute K operation results of the objective function respectively corresponding to the K candidate quantum circuits; and obtain the performance evaluation index based on the K operation results.

20. The apparatus according to claim 15, wherein the processor circuitry is configured to:

determine a candidate quantum circuit with a largest generation probability from the updated K candidate quantum circuits; and determine the candidate quantum circuit as the target quantum circuit.

* * * * *